(12) United States Patent
Ando et al.

(10) Patent No.: US 10,847,230 B2
(45) Date of Patent: Nov. 24, 2020

(54) MEMORY SYSTEM AND METHOD OF CONTROLLING NONVOLATILE MEMORY

(71) Applicant: TOSHIBA MEMORY CORPORATION, Minato-ku (JP)

(72) Inventors: Yuki Ando, Shinagawa (JP); Shuou Nomura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/286,759

(22) Filed: Feb. 27, 2019

(65) Prior Publication Data

US 2020/0090761 A1    Mar. 19, 2020

(30) Foreign Application Priority Data

Sep. 14, 2018   (JP) ................. 2018-172058

(51) Int. Cl.
| | |
|---|---|
| *G11C 16/26* | (2006.01) |
| *G11C 16/04* | (2006.01) |
| *G06F 3/06* | (2006.01) |
| *G11C 11/56* | (2006.01) |

(52) U.S. Cl.
CPC ............ *G11C 16/26* (2013.01); *G06F 3/0604* (2013.01); *G06F 3/0659* (2013.01); *G06F 3/0679* (2013.01); *G11C 16/0483* (2013.01); *G11C 11/5642* (2013.01); *G11C 11/5671* (2013.01)

(58) Field of Classification Search
None
See application file for complete search history.

(56) References Cited

U.S. PATENT DOCUMENTS

| | | | |
|---|---|---|---|
| 2008/0123408 A1* | 5/2008 | Honma | ............... G06F 11/1072 365/185.03 |
| 2013/0185598 A1* | 7/2013 | Haratsch | ................. G06F 11/10 714/42 |
| 2015/0278015 A1 | 10/2015 | Haratsch et al. | |
| 2016/0011970 A1 | 1/2016 | Sakurada | |
| 2016/0027521 A1 | 1/2016 | Lu | |
| 2016/0080004 A1 | 3/2016 | Yamaki et al. | |

OTHER PUBLICATIONS

Park et al., A Zeroing Cell-to-Cell Interference Page Architecture With Temporary LSB Storing and Parallel MSB Program Scheme for MLC NAND Flash Memories, IEEE, 10 pages (Year: 2008).*

* cited by examiner

*Primary Examiner* — Gary W. Cygiel
(74) *Attorney, Agent, or Firm* — Oblon, McClelland, Maier & Neustadt, L.L.P.

(57) ABSTRACT

According to one embodiment, a memory system includes a nonvolatile memory and a memory controller. The nonvolatile memory includes a memory string including memory cells including first to third memory cells, and a selection transistor connected to the memory cells, and first to third word lines that are connected to gates of the first to third memory cells of the memory string. The memory controller reads data of the first to third memory cells by applying first to third read voltages to the first to third word lines, respectively. The memory controller reads second data by applying a fourth read voltage to the second word line in parallel to processing of decoding first data, obtains likelihood information on the basis of the first data, the second data, and at least one of the third data and the fourth data, and decodes data on the basis of the likelihood information.

20 Claims, 21 Drawing Sheets

| HB | LOWER SIDE SHIFT | HIGHER SIDE SHIFT | STATE (UP) | STATE (DOWN) | LLR |
|---|---|---|---|---|---|
| 0 | 0 | 0 | 0 | 0 | -127 |
| ... | ... | ... | ... | ... | ... |
| 0 | 1 | 0 | 0 | 0 | -50 |
| 0 | 1 | 0 | 0 | 1 | -30 |
| 0 | 1 | 0 | 1 | 0 | -30 |
| 0 | 1 | 0 | 1 | 1 | -10 |
| ... | ... | ... | ... | ... | ... |
| 1 | 1 | 1 | 1 | 1 | 127 |

| HB | SHIFT TO LOWER SIDE BY 5△R | SHIFT TO LOWER SIDE BY 3△R | SHIFT TO HIGHER SIDE BY 3△R | SHIFT TO HIGHER SIDE BY 5△R | STATE (UP) | STATE (DOWN) | LLR |
|---|---|---|---|---|---|---|---|
| 0 | 0 | 0 | 0 | 0 | 0 | 0 | -127 |
| ... | ... | ... | ... | ... | ... | ... | ... |
| 1 | 1 | 1 | 1 | 1 | 1 | 1 | 127 |

| HB | LOWER SIDE SHIFT | HIGHER SIDE SHIFT | STATE ST1 (UP) | STATE ST2 (UP) | STATE ST1 (DOWN) | STATE ST2 (DOWN) | LLR |
|---|---|---|---|---|---|---|---|
| 0 | 0 | 0 | 0 | 0 | 0 | 0 | -127 |
| ... | ... | ... | ... | ... | ... | ... | ... |
| 1 | 1 | 1 | 1 | 1 | 1 | 1 | 127 |

FIG.23

| STATE | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| PAGE X | 1 | 0 | 0 | 0 | 1 | 1 | 0 | 0 | 0 | 0 | 0 | 1 | 1 | 1 | 1 | 1 |

READ POSITION: P1, P2, P5, P3, P4

| HB | LOWER SIDE SHIFT | HIGHER SIDE SHIFT | DETER-MINATION BIT | STATE (UP) | STATE (DOWN) | LLR |
|---|---|---|---|---|---|---|
| 0 | 0 | 0 | 0 | 0 | 0 | -127 |
| ... | ... | ... | ... | ... | ... | ... |
| 0 | 1 | 0 | 0 | 0 | 0 | -50 |
| 0 | 1 | 0 | 1 | 0 | 0 | -40 |
| ... | ... | ... | ... | ... | ... | ... |
| 1 | 1 | 1 | 1 | 1 | 1 | 127 |

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2018-172058, filed on Sep. 14, 2018; the entire contents of which are incorporated herein by reference.

FIELD

Embodiments described herein relate generally to a memory system.

BACKGROUND

In the memory system, generally, error correcting encoded data is stored. According to this, when reading data stored in a memory system, decoding with respect to the error correcting encoded data is performed.

BRIEF DESCRIPTION OF THE DRAWINGS

FIG. 23 is a view illustrating a read position of read processing;

DETAILED DESCRIPTION

In general, according to one embodiment, a memory system includes a nonvolatile memory and a memory controller. The nonvolatile memory includes a memory string including a plurality of memory cells including first to third memory cells that are connected in series, and a selection transistor that is electrically connected to the plurality of memory cells in series, and first to third word lines that are electrically connected to gates of the first to third memory cells of the memory string. The memory controller is configured to read data of the first to third memory cells by applying first to third read voltages to the first to third word lines, respectively. The memory controller reads second data by applying a fourth read voltage, which varies from the second read voltage, to the second word line in parallel to processing of decoding first data by the second read voltage, obtains likelihood information on the basis of the first data, the second data, and at least one of the third data and the fourth data, and decodes data that is read from the second memory cell on the basis of the likelihood information.

A memory system according to this embodiment will be described in detail with reference to the accompanying drawings. Furthermore, the invention is not limited by embodiments to be described below.

First Embodiment

Figure 1:
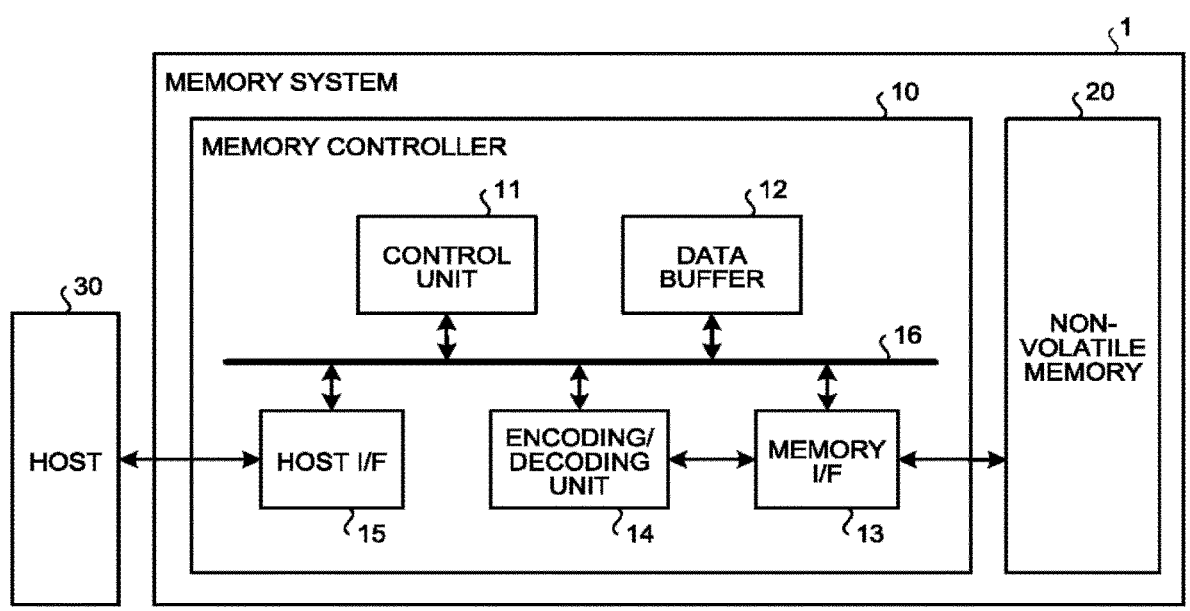
FIG. 1 is a block diagram illustrating a schematic configuration example of a memory system according to a first embodiment.

First, a memory system according to a first embodiment will be described in detail with reference to the accompanying drawings. FIG. 1 is a block diagram illustrating a schematic configuration example of the memory system according to the first embodiment. As illustrated in FIG. 1, a memory system 1 includes a memory controller 10 and a nonvolatile memory 20. The memory system 1 can be connected to a host 30, and a state of being connected to the host 30 is illustrated in FIG. 1. For example, the host 30 may be an electronic device such as a personal computer and a portable terminal.

The nonvolatile memory 20 is a nonvolatile memory that stores data in a nonvolatile manner, and examples thereof include a NAND type flash memory (hereinafter, simply referred to as a NAND memory). In the following description, a case where the NAND memory is used as the nonvolatile memory 20 is exemplified, but a storage device such as a three-dimensional structure flash memory, a resistive random access memory (ReRAM), and a ferroelectric random access memory (FeRAM) other than the NAND memory can also be used as the nonvolatile memory 20. In addition, it is not necessary for the nonvolatile memory 20 to be a semiconductor memory, and this embodiment is applicable to various storage media other than the semiconductor memory.

The memory system 1 may be a so-called solid state drive (SSD) or various memory systems, which include the nonvolatile memory 20, such as a memory card including the memory controller 10 and the nonvolatile memory 20 as one package.

The memory controller 10 controls writing in the nonvolatile memory 20 in accordance with a writing request from the host 30. In addition, the memory controller 10 controls reading from the nonvolatile memory 20 in accordance with a read request from the host 30. For example, the memory controller 10 is a semiconductor integrated circuit that is comprised by a system on a chip (SoC). The memory controller 10 includes a host interface (host I/F) 15, a memory interface (memory I/F) 13, a control unit 11, an encoding/decoding unit (CODEC) 14, and a data buffer 12. The host I/F 15, the memory I/F 13, the control unit 11, the encoding/decoding unit 14, and the data buffer 12 are connected to each other through an internal bus 16. Parts or the entirety of operations of respective constituent elements of the memory controller 10 to be described below may be realized when a central processing unit (CPU) executes firmware, or may be realized by hardware.

The host I/F 15 performs processing according to an interface standard with the host 30, and outputs a command received from the host 30, writing target user data, and the like to the internal bus 16. In addition, the host I/F 15 transmits user data that is read from the nonvolatile memory 20 and is restored, a response from the control unit 11, and the like to the host 30.

The memory I/F 13 performs writing processing in the nonvolatile memory 20 on the basis of an instruction from the control unit 11. In addition, the memory I/F 13 performs read processing from the nonvolatile memory 20 on the basis of an instruction from the control unit 11.

The data buffer 12 temporarily stores user data that is received from the host 30 by the memory controller 10 until the user data is stored in the nonvolatile memory 20. In addition, the data buffer 12 temporarily stores user data that is read from the nonvolatile memory 20 until the user data is transmitted to the host 30. As the data buffer 12, for example, a general-purpose memory such as a static random access memory (SRAM) and a dynamic random access memory (DRAM) can be used. Furthermore, the data buffer 12 may be mounted at the outside of the memory controller 10 without being embedded in the memory controller 10.

The control unit 11 collectively controls respective constituent elements of the memory system 1. When receiving a command from the host 30 through the host I/F 15, the control unit 11 performs control according to the command. For example, the control unit 11 instructs the memory I/F 13 to write user data and a parity in the nonvolatile memory 20 in accordance with a command from the host 30. In addition, the control unit 11 instructs the memory I/F 13 to read the user data and the parity from the nonvolatile memory 20 in accordance with a command from the host 30.

In addition, in the case of receiving a writing request of user data from the host 30, the control unit 11 determines a storage region (memory region) on the nonvolatile memory 20 with respect to user data that is stored in the data buffer 12. That is, the control unit 11 manages a writing destination of the user data. A correspondence between a logical address of the user data received from the host 30 and a physical address indicating a storage region on the nonvolatile memory 20 in which the user data is stored is stored as an address translation table.

In addition, in the case of receiving a read request from the host 30, the control unit 11 translates a logical address designated by the read request into a physical address by using the address translation table, and instructs the memory I/F 13 to perform reading from the physical address.

In the NAND memory, typically, writing and reading are performed in a data unit called a page, and erasing is performed in a data unit called a block.

Figure 2:
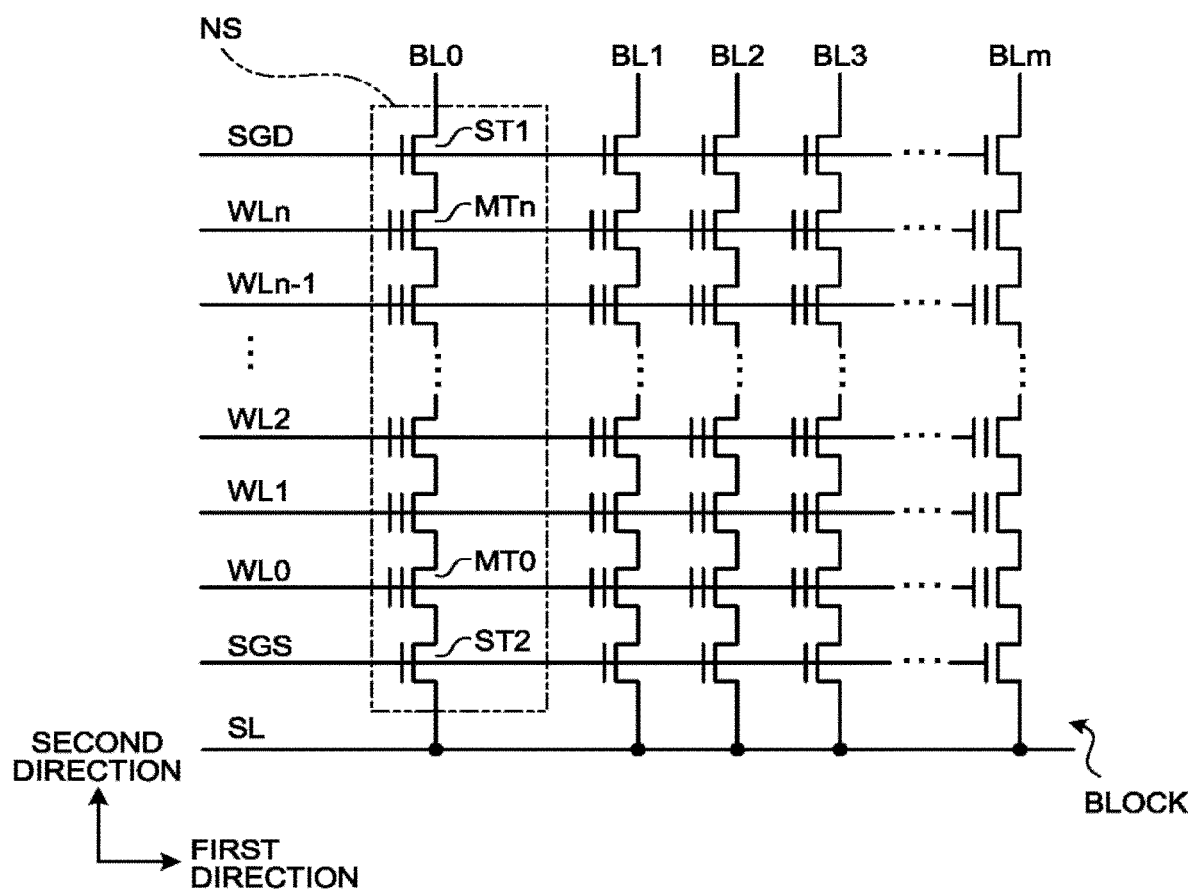
FIG. 2 is a view illustrating a configuration example of a block.

FIG. 2 is a view illustrating a configuration example of a block. Each block includes (m+1) NAND strings NS that are sequentially arranged in a predetermined first direction (m is an integer of 0 or greater). Each of the NAND strings is also referred to as a memory string. Drains of selection transistors ST1, which are respectively included in the (m+1) NAND strings NS, are respectively connected to bit lines BL0 to BLm, and gates thereof are commonly connected to a selection gate line SGD. Sources of selection transistors ST2 are commonly connected to a source line SL, and gates thereof are commonly connected to a selection gate line SGS.

In the respective NAND strings NS, (n+1) memory cell transistors MT are arranged in such a manner that current paths are electrically connected in series in a predetermined second direction between the source of the selection transistor ST1 and the drain of the selection transistor ST2 (n is an integer of 0 or greater).

Control gate electrodes are respectively connected to word lines WL0 to WLn in the order from a memory cell transistor MT that is located on the most source side. Accordingly, a source of a memory cell transistor MT0 connected to the word line WL0 is connected to a drain of the selection transistor ST2, and a drain of the memory cell transistor MTn connected to the word line WLn is connected to a source of the selection transistor ST1.

Each of the word lines WL0 to WLn commonly connects control gate electrodes of memory cell transistors MT between the NAND strings NS in the block. That is, control gate electrodes of memory cell transistors MT adjacent to each other in the predetermined first direction between the NAND strings NS in the block are connected to the same word line WL. (m+1) memory cell transistors MT that are connected to the same word line WL are referred to as a memory cell group. Furthermore, the memory cell transistors MT are also referred to as memory cells.

When each of the memory cells is a single-level cell (SLC), one memory cell group corresponds to one page. When the memory cell is a multiple-level cell (MLC), one memory cell group corresponds to a plurality of pages. Furthermore, in the following description, the MLC includes a triple-level cell (TLC) in which three bits are stored in one memory cell, a quad-level cell (QLC) in which four bits are stored in one memory cell, and the like. In addition, each of the memory cells can be identified by an address that identifies a word line and an address that identifies a bit line.

When reading data from the nonvolatile memory 20, a read voltage is applied to a word line to which a memory cell in which read target data is written is connected, and a predetermined voltage (VREAD) is applied to word lines other than the word line to which the memory cell in which the read target data is written is connected. VREAD is a voltage that causes the memory cell to enter an ON state regardless of data that is stored in the memory cell.

User data transmitted from the host 30 is transmitted to the internal bus 16 and is temporarily stored in the data buffer 12. The encoding/decoding unit 14 encodes the user data stored in the nonvolatile memory 20 to generate a code word. In addition, the encoding/decoding unit 14 decodes the code word (also referred to as "reception word") that is read from the nonvolatile memory 20 to restore the user data. Furthermore, data that is encoded by the encoding/decoding unit 14 may also include control data that is used at the inside of the memory controller 10, and the like in addition to the user data.

Next, details of decoding processing of the code word will be described. Examples of a decoding technology of an error correcting code include hard bit decoding (hard-decision decoding) and soft bit decoding (soft-decision decoding). In the hard bit decoding, an input value is one bit (hard bit) of 0 or 1. In contrast, in the soft bit decoding, an input value is likelihood information such as log likelihood ratio (LLR) indicating accuracy of 0 or 1. The LLR is expressed, for example, a numerical value in a range of −127 (a probability of 0 is high) to 127 (a probability of 1 is high).

Next, read of data from the nonvolatile memory 20 will be further described. As described above, each of the memory cells of the nonvolatile memory 20 can store data corresponding to one page (the case of the SLC) or a plurality of pages (the case of the MLC). In the following description, read of data of each page from the memory cell is referred to as "page read". In the page read, a processing result (read data) indicating that data of a read target page is either 0 or 1 is obtained.

Figure 3:
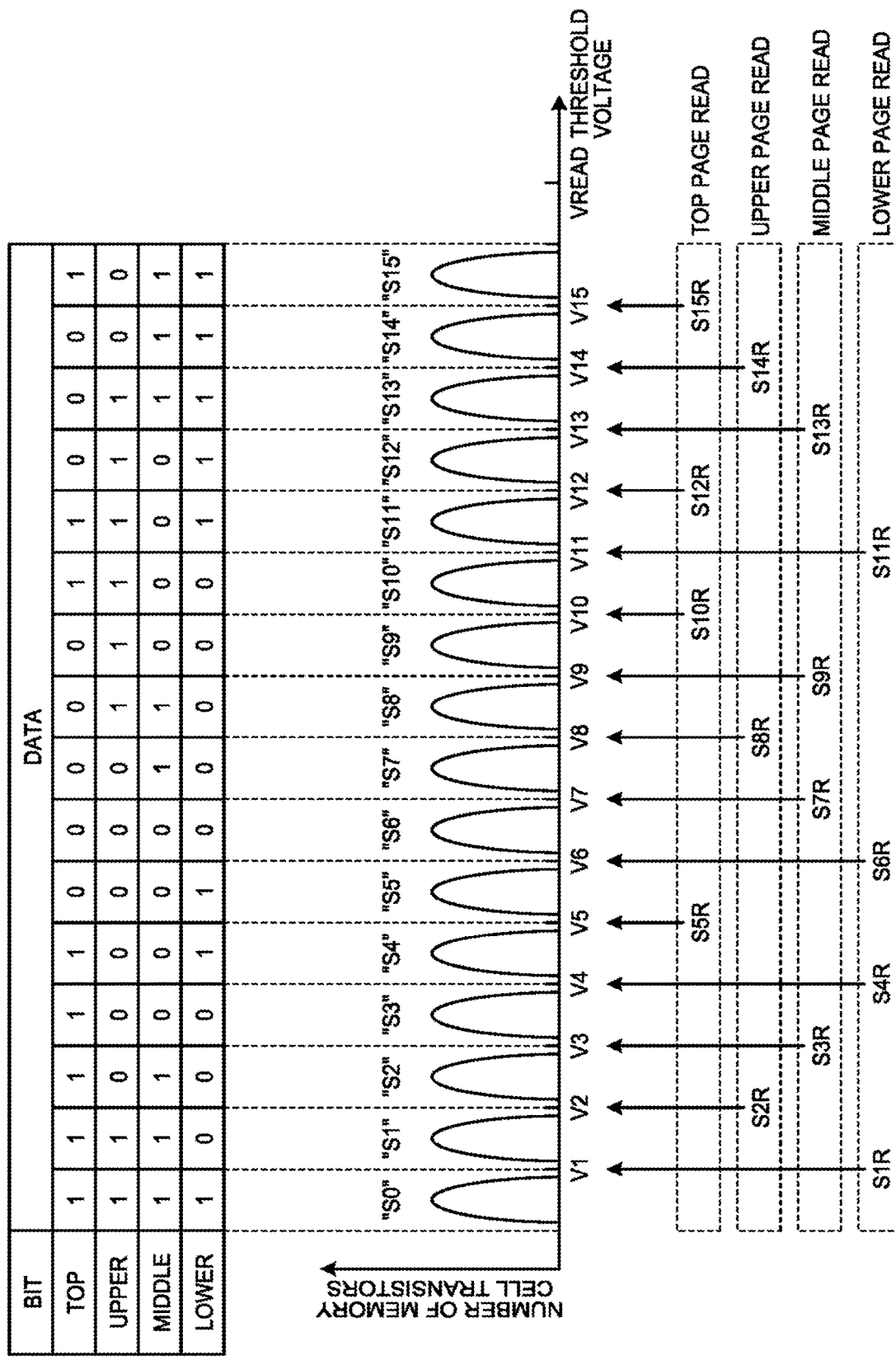
FIG. 3 is a view illustrating a specific example of a page read.

FIG. 3 is a view illustrating a specific example of the page read. FIG. 3 illustrates an example of data coding and page read in the QLC. In the QLC, four-bit data stored in one memory cell is referred to as, for example, a top bit, an upper bit, a middle bit, and a lower bit.

An assembly of top bits of all memory cells connected to the same word line is referred to as a "top page". An assembly of upper bits of all memory cells connected to the same word line is referred to as an "upper page". An assembly of middle bits of all memory cells connected to the same word line is referred to as a "middle page". An assembly of lower bits of all memory cells connected to the same word line is referred to as a "lower page".

In the case of the QLC, as illustrated in FIG. 3, a range capable of taking a threshold voltage is divided into sixteen parts. Sixteen divisions are referred to as "S0" state, "S1" state, "S2" state, "S3" state, "S4" state, "S5" state, "S6" state, "S7" state, "S8" state, "S9" state, "S10" state, "S11" state, "S12" state, "S13" state, "S14" state, and "S15" state in this order from a low threshold voltage side. The state corresponds to information indicating the magnitude of the threshold voltage.

In the page read, reading is performed by using a plurality of read voltages that are determined for every page, and from a read result in accordance with the plurality of read voltages, it is specified that data of each page is either 0 or 1. In the example of FIG. 3, in the case of page read (lower page read) in which a lower page is set as a target, four read voltages of V1, V4, V6, and V11 is used.

In the read in accordance with each of the read voltages, a one-bit read result (read data) indicating whether or not a threshold voltage of a memory cell is greater than the read voltage is obtained. For example, when the threshold voltage is greater than the read voltage, read data indicating "0" is obtained. In addition, when the threshold voltage is smaller than the read voltage, read data indicating "1" is obtained. In the following description, processing of acquiring read data indicating the magnitude of the threshold voltage in relation to one read voltage is referred to as "single state read".

In the page read, it is specified that data of each page is either 0 or 1 from read data obtained through a plurality of times of single state read. S1R to S15R in FIG. 3 illustrate single state read using read voltages V1 to V15. In the example of FIG. 3, it is assumed that read results of the lower page at four read voltages of V1, V4, V6, and V11 are 0, 0, 1, and 1. In this case, it can be specified that a threshold voltage of a memory cell is greater than V4 and is less than V6, that is, data of the lower page is 1.

In a similar manner, it is specified that data of the middle page, the upper page, and the top page is either 0 or 1. From read data of four pages, it can be specified that a memory cell corresponds to which state.

Further, the page read can be divided into hard bit read, shift read, and soft bit read. The hard bit read is a method in which data of a memory cell is read as a bit value of 0 or 1. In the hard bit read, a reference read voltage that is determined in advance is used.

The shift read is a method in which voltages that shift from the reference read voltage to the higher side and the lower side by $\Delta R$ are used as read voltages, and data of a memory cell is read as a bit value (hard bit) of 0 or 1.

Figure 4:
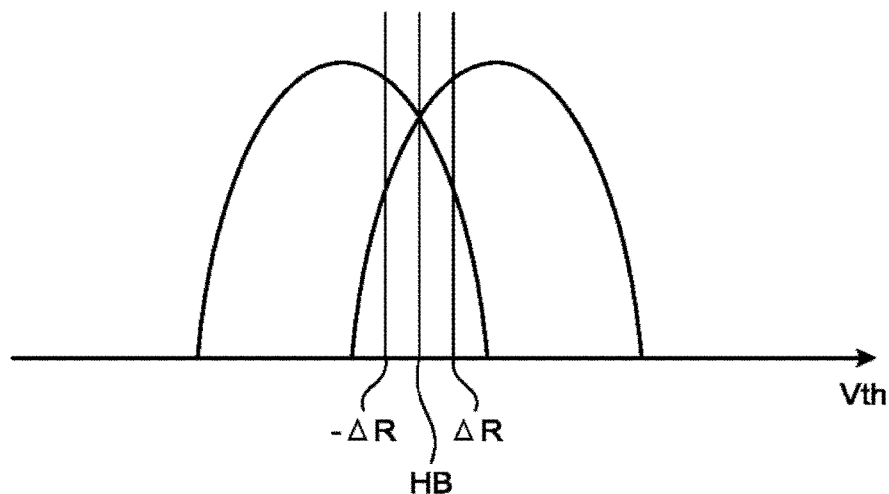
FIG. 4 is a view illustrating shift read.

FIG. 4 is a view illustrating the hard bit read and the shift read. A hard bit (HB) represents a value that is read at the reference read voltage that is determined in advance. For example, each memory cell compares the reference read voltage and a threshold voltage that is stored in the memory cell, and outputs a read result indicating a comparison result. For example, the read result is expressed as "0" or "1", or "High" or "Low". As described above, the read result is information indicating whether or not the threshold voltage of the memory cell is greater than the read voltage. In the shift read, read voltages that shift from the reference read voltage to the higher side and the lower side by $\Delta R$ are used.

The soft bit read is a method in which a soft bit is read as read data. For example, the soft bit is a one-bit value that is obtained by operating two read results through the shift read performed twice with XNOR. Furthermore, the LLR can be calculated by using the soft bit that is calculated as described above. For example, a difference value of LLR is determined with respect to each of combinations of four patterns ("0, 1", "0, 0", "1, 0", "1, 1") of one bit of the hard bit and one bit of the soft bit. For example, the value of the LLR is calculated by using an LLR table in which a value of the LLR with respect to each pattern is determined. A range that the LLR can take may be determined in any manner.

Next, a factor that has an influence on the decoding processing will be described. In the NAND memory, there is known a phenomenon (referred to as lateral leakage of charges) in which charges accumulated in a memory cell migrate to adjacent cell in accordance with a threshold voltage difference with an adjacent memory cell (adjacent cell). Lateral leakage of charges may be a cause for a bit error. In the following description, the adjacent cell represents a memory cell that is connected to the same bit line as in a target cell among a plurality of memory cells that are connected to word lines vertically adjacent to a word line to which the target cell is connected.

Figure 5:
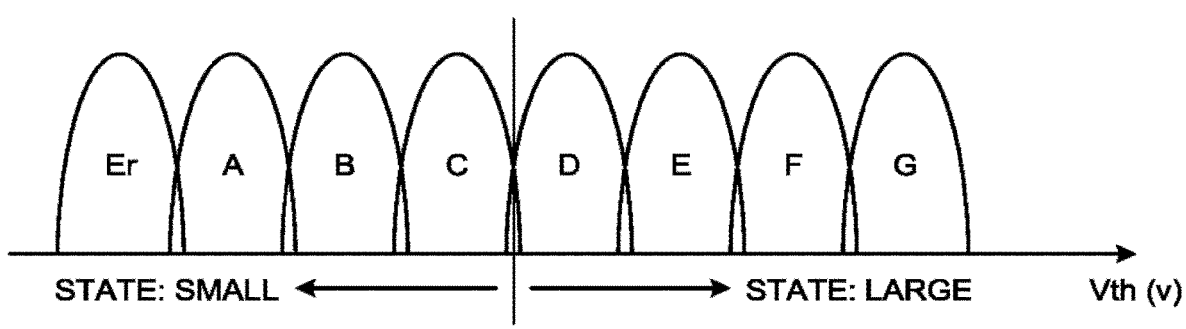
FIG. 5 is a view illustrating an example of a state.

As described above, information indicating a magnitude of the threshold voltage is referred to as "state". FIG. 5 is a view illustrating an example of the state. FIG. 5 illustrates an example of eight states (Er, A, B, C, D, E, F, and G) corresponding to a three-bit data value that is stored in the TLC. For example, the respective states can be divided into small states (state: small) and large states (state: large) in accordance with a range equal to or less than the state C and a range equal to or greater than the state D.

For example, when an adjacent cell (a first memory cell and a third memory cell) of a target cell (a second memory cell), which is a target of decoding, belongs to "state: large", charges flow from the adjacent cell, and thus there is a possibility that a threshold voltage of the target cell may rise. In contrast, when the adjacent cell belongs to "state: small", charges flow to the adjacent cell from the target cell, and thus there is a possibility that the threshold voltage of the target cell may lower. As described above, there is a possibility that the threshold voltage of the target cell may vary in accordance with a state of the adjacent cell.

As a countermeasure for the lateral leakage of charges between adjacent cells, there is a technology of varying a read voltage for every target cell in accordance with a magnitude of a threshold voltage of an adjacent cell. For example, when the threshold voltage of the adjacent cell is large, the read voltage is made to be higher than the reference read voltage, and when the threshold voltage of the adjacent cell is small, the read voltage is made to be lower than the reference read voltage. In the technology, the number of times of read may be increased to improve decoding performance, but in this case, a processing time is lengthened.

In this embodiment, the LLR is obtained by using a read result of the shift read as is instead of a soft bit obtained by operating (XNOR and the like) the read result obtained in the shift read. In addition, in this embodiment, a value indicating the magnitude of the state of the adjacent cell is also used to obtain the LLR. The value indicating the magnitude of the state can be obtained by performing single state read with respect to the adjacent cell. The value indicating the magnitude of the state is not limited to the binary information indicating that the state is large or small (state: large or state: small) as described above. For example, the value may be information indicating any of the states (in the example illustrated in FIG. 5, octal information).

Figures 6, 7:
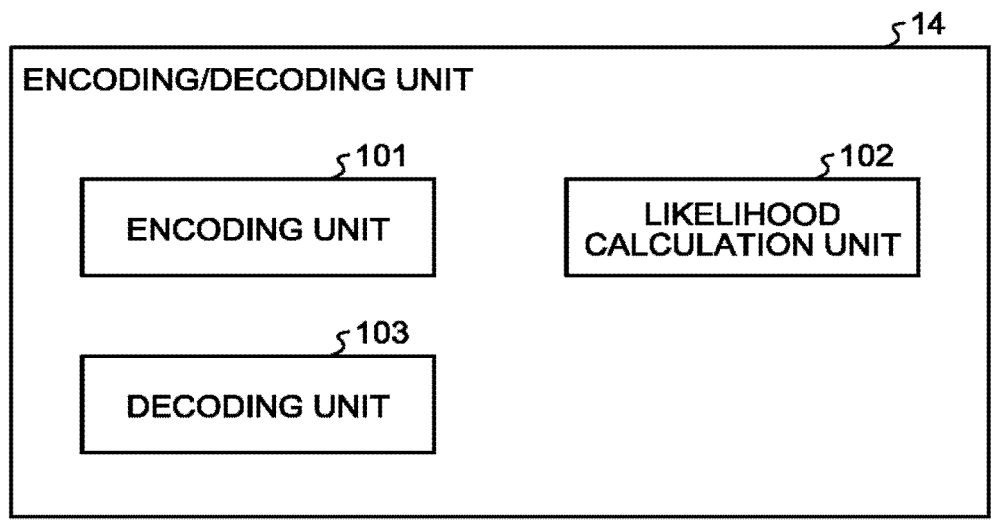
FIG. 6 is a block diagram illustrating an example of a functional configuration of an encoding/decoding unit.
FIG. 7 is a view illustrating an example of an LLR table.

FIG. 6 is a block diagram illustrating an example of a functional configuration of the encoding/decoding unit 14. As illustrated in FIG. 6, the encoding/decoding unit 14 includes an encoding unit 101, a likelihood calculation unit 102, and a decoding unit 103.

The encoding unit 101 encodes user data to generate a code word. The likelihood calculation unit 102 calculates the LLR of a bit stored in each memory cell. The decoding unit 103 decodes the code word by using the LLR (soft bit decoding). The decoding unit 103 may further have a function of executing hard bit decoding. Hereinafter, functions of respective units will be further described by dividing processing into writing processing and a read processing.

First, writing processing with respect to the nonvolatile memory 20 will be described. The control unit 11 instructs the encoding unit 101 to encode the user data when writing the user data in the nonvolatile memory 20. At this time, the control unit 11 determines a storage location (storage address) of the code word in the nonvolatile memory 20, and gives an instruction for the determined storage location to the memory I/F 13.

The encoding unit 101 encodes the user data on the data buffer 12 on the basis of the instruction from the control unit 11 to generate a code word. As an encoding method, for example, an encoding method using algebraic code such as a Bose-Chaudhuri-Hocquenghem (BCH) code and a Reed-Solomon (RS) code, and an encoding method using a code such as a low density parity check (LDPC) code based on a sparse graph can be used. The memory I/F 13 performs control of storing the code word in a storage location on the nonvolatile memory 20, which is given in the instruction from the control unit 11.

Next, read processing from the nonvolatile memory 20 will be described. The control unit 11 designates an address on the nonvolatile memory 20 in reading from the nonvolatile memory 20, and instructs the memory I/F 13 to perform reading. The memory I/F 13 inputs a command of the read processing to the nonvolatile memory 20 on the basis of the address that is input from the control unit 11.

Each of the memory cells in the nonvolatile memory 20 executes read processing in accordance with the command that is input from the memory I/F 13, and returns read data that is a processing result. The command of the read processing includes information indicating that among hard bit read, soft bit read, shift read, and single state read, which read is to be executed. The memory cell executes any of the hard bit read, the soft bit read, the shift read, and the single state read in accordance with the information.

For example, when the hard bit read is designated, the memory cell returns a read result (HB) at the reference read voltage (second read voltage) as read data. For example, the memory cell executes a plurality of times of single state read using a plurality of reference read voltages that are determined with respect to read pages, and returns read data (hard bit) that is specified by the read result of the plurality of times of single state read.

When the soft bit read is designated, the memory cell stores a read result obtained by using a read voltage (fourth read voltage) that is varied from the plurality of reference read voltages determined with respect to read pages by a designated shift amount (corresponding to $\Delta R$), for example, in the internal buffer. The memory cell performs operation (XNOR and the like) by using a plurality of the read results stored in the internal buffer, and returns an operation result (SB) as read data. The shift amount may be designated by a command that designates the soft bit read, or may be designated by a command different from the command.

When the sift read is designated, the memory cell returns a read result obtained by using a read voltage that is varied from the reference read voltages by the designated shift amount (corresponding to $\Delta R$) as read data. For example, the memory cell executes a plurality of times of single state read using a read voltage that is varied from a plurality of reference read voltages determined with respect to read pages by the shift amount, and returns read data (hard bit) that is specified by the read result of the plurality of times of single state read. The shift amount may be designated by a command that designates the shift read, or may be designated by a command different from the command.

When the single state read is designated, the memory cell returns a read result obtained by using a read voltage that is designated as read data. The read voltage that is used may be designated by a command that designates the read of the single state read, or may be designated by a command different from the command.

The memory I/F 13 outputs the read data that is returned by the nonvolatile memory 20 with respect to the command of the read processing to the likelihood calculation unit 102.

The likelihood calculation unit 102 calculates an LLR of a bit stored in the memory cell on the basis of the read data that is input from the memory I/F 13. The likelihood calculation unit 102 outputs the LLR that is calculated to the decoding unit 103.

In this embodiment, the likelihood calculation unit 102 calculates the LLR by using read result (first data) of the hard bit read of a target cell, a read result (second data) of the shift read of the target cell, and a state (third data, fourth data) of an adjacent cell.

The state of the adjacent cell is determined, for example, by a single state read using a read voltage (a first read voltage, a third read voltage) corresponding to a threshold voltage that becomes a boundary for determination as to whether or not the threshold voltage of the memory cell is large). In the example illustrated in FIG. 5, a read voltage corresponding to a boundary between the states C and D is used in the single state read.

For example, the likelihood calculation unit 102 calculates the value of the LLR by an LLR table in which values of the LLR that correspond to the read result of the hard bit read of the target cell, the read result of the shift read of the target cell, and the state of the adjacent cell are determined.

FIG. 7 is a view illustrating an example of the LLR table. FIG. 7 is an example of the LLR table in which the values of the LLR are determined in accordance with combinations (32 kinds) of five bits of the read result (HB) of the hard bit read, the read results of lower and higher side shift reads (lower side shift, higher side shift), and states of an adjacent cell (state (up) and state (down)). In the following description, information (values of five bits in the example illustrated in FIG. 7) for determining the value of the LLR may be referred to as input values of the LLR table.

The likelihood calculation method is not limited to the method using the LLR table. For example, the likelihood calculation unit 102 may calculate the LLR through operation processing of calculating the values of the LLR by inputting the input values.

The decoding unit 103 performs error correcting processing through soft bit decoding by using the LLR that is input from the likelihood calculation unit 102, and restores the user data that is the read target. For example, the restored user data is input to the control unit 11, and is transmitted to the host 30 through the host I/F 15.

Figure 8:
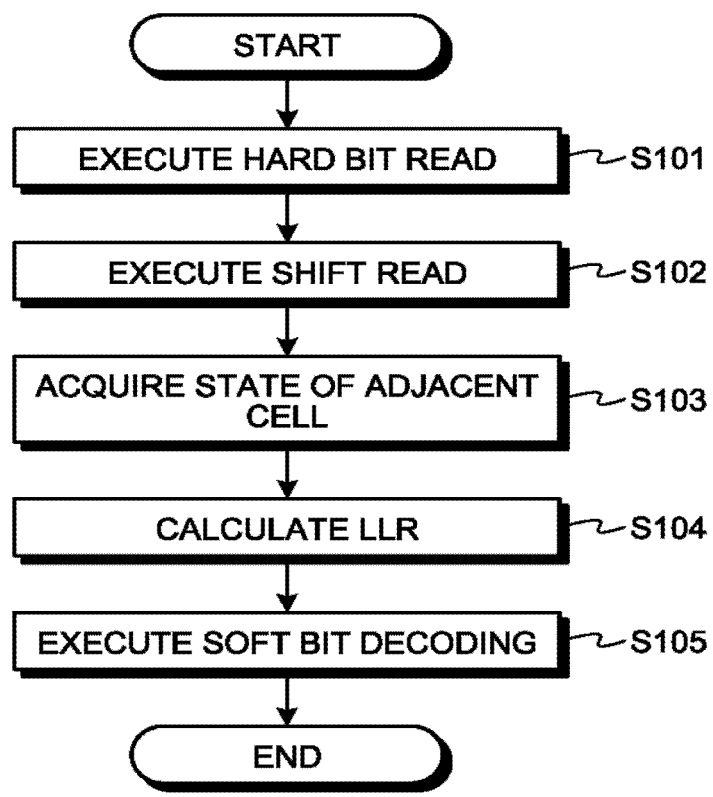
FIG. 8 is a flowchart illustrating an example of decoding processing in the first embodiment.

Next, decoding processing by the memory system 1 according to the first embodiment configured as described above will be described. FIG. 8 is a flowchart illustrating an example of the decoding processing in the first embodiment.

The control unit 11 executes the hard bit read of a target cell (Step S101). The control unit 11 executes the shift read of the target cell (Step S102). The control unit 11 acquires a state of an adjacent cell that is adjacent to the target cell (Step S103). For example, the control unit 11 gives an instruction for execution of the single state read using a read voltage that is determined in advance with respect to the adjacent cell.

The likelihood calculation unit 102 acquires read data obtained through respective kinds of processing from Step S101 to Step S103 from the memory I/F 13. The likelihood calculation unit 102 calculates the LLR by using the read data that is obtained (Step S104). For example, the likelihood calculation unit 102 calculates the LLR that corresponds to the read result of the hard bit read of the target cell, the read results of the lower and higher side shift reads (lower side shift, higher side shift), and the state (state (up), state (down)) of the adjacent cell by using the LLR table as illustrated in FIG. 7.

The decoding unit 103 executes soft bit decoding by using the LLR that is calculated (Step S105).

Figure 9:
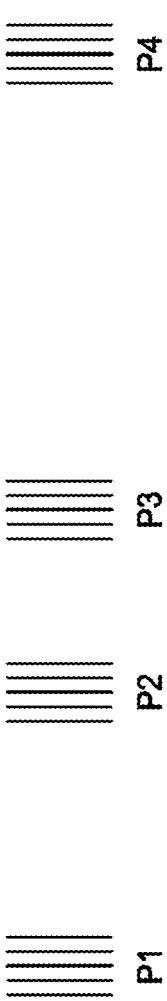
FIG. 9 is a view illustrating an example of correspondence between a state and data coding in a QLC.

Next, a specific example of the LLR to be calculated will be described. FIG. 9 is a view illustrating an example of correspondence between a state and data coding in the QLC. In the case of the QLC, four-bit values can be allocated to sixteen states of S0 to S15. In addition, an assembly of bits of the same digit among the four bits being allocated to the respective states is correlated with any one page among four pages. FIG. 9 illustrates an example of data correlated with a page X included in the four pages.

Figure 10:
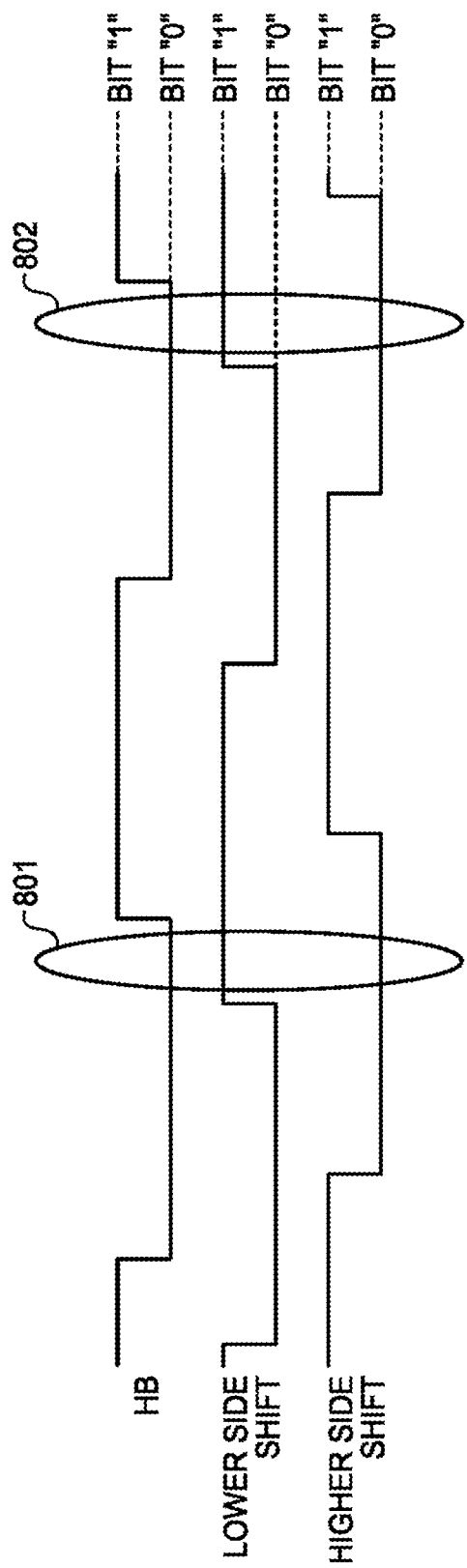
FIG. 10 is a view illustrating concept of shift read in the QLC.

FIG. 10 is a view illustrating a concept of the shift read in the QLC having the same data coding as in FIG. 9. HB represents a read result by the hard bit read. Lower side shift and higher side shift represent read results obtained by shift reads using read voltages that shift from the reference read voltage used in the hard bit read to the higher side and to the lower side by ΔR.

In the case of the data coding as illustrated in FIG. 9, bit values of respective states vary in a manner of "1" (S0), "0" (S1 to S3), "1" (S4 to S5), "0" (S6 to S10), and "1" (S11 to S15) from S0 toward S1. FIG. 10 schematically illustrates the bit values that vary in this manner.

In the example illustrated in FIG. 9, read processing is performed at four read positions P1 to P4 at which the bit values vary. Frames 801 and 802 in FIG. 10 represent read positions corresponding to P2 and P4 in FIG. 9. At the read positions, values of HB, lower side shift, and higher side shift become, for example, "0", "1", and "0".

For example, a value representing a magnitude of a state of an adjacent cell can be set to "1" when the state is S7 or less, and "0" when the state is S8 or greater. When assuming that the states of adjacent cells are both "0" (S8 or greater), a five-bit value illustrated in FIG. 7 becomes "01000" at read positions of the frames 801 and 802. Since the state of the adjacent cell is "0" (state: large), a voltage of the target cell becomes an ascending tendency. Accordingly, there is a high possibility that, bit error into "1" may occur in the value "0" of the higher side shift between the value "1" of the lower side shift and the value "0" of the higher side shift. Accordingly, a value of the LLR corresponding to an input value of "01000" is set to a value closer to −127. In the example illustrated in FIG. 7, the LLR is set to −50.

When assuming that states of adjacent cells are both "1" (S7 or less), a five-bit value illustrated in FIG. 7 at the read positions of the frames 801 and 802 becomes "01011". Since the states of the adjacent cells are "1" (state: small), a voltage of a target cell becomes a descending tendency. Accordingly, there is a high possibility that bit error into "0" may occur in the value "1" of the lower side shift between the value "1" of the lower side shift and the value "0" of the higher side shift. Accordingly, a value of the LLR corresponding to an input value of "01011" is set to a value closer to 127. In the example illustrated in FIG. 7, the LLR is set to −10.

As described above, in this embodiment, the LLR is calculated by dividing the read result of the shift read and an influence amount (a state of an adjacent cell) of the adjacent cell, for example, into 32 kinds of patterns. According to this, it is possible to enhance the performance of the soft bit decoding without increasing the number of times of read.

Modification Example 1

Figures 11, 12:
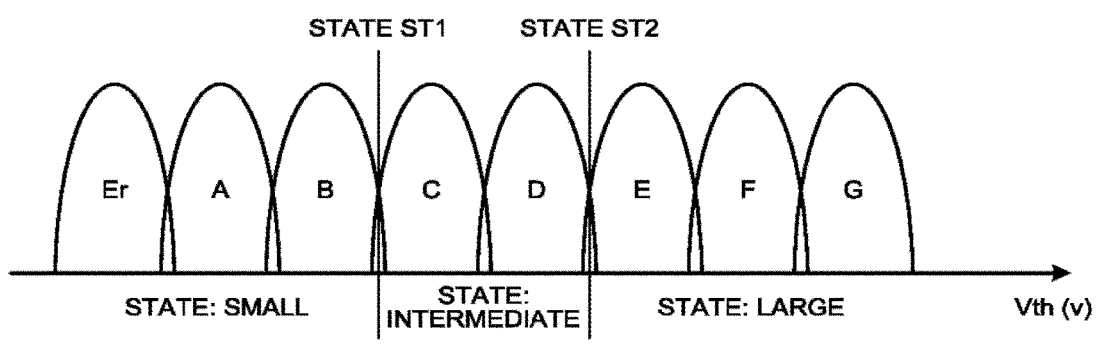
FIG. 11 is a view illustrating an example of an LLR table that is used in the case of executing shift read two times on a higher side and on a lower side, respectively.
FIG. 12 is a view illustrating an example of a state dividing method.

In the above-described example, shift read is executed once each on the higher and lower sides. The number of times of the shift read is not limited thereto. For example, two or more times of shift read may be executed on the higher side and on the lower side. FIG. 11 is a view illustrating an example of the LLR table that is used in the case of executing two times of shift read on the higher side and on the lower side, respectively. The likelihood calculation unit 102 calculates the LLR in accordance with four values obtained in the shift read in accordance with four shift amounts including 5ΔR (five times of ΔR) on the higher side and on the lower side, and 3ΔR (three times of ΔR) on the higher side and on the lower side, the HB, and the state of the adjacent cell. In this manner, the likelihood calculation unit 102 may calculate the LLR by using the read result by the shift read using a plurality of shift amounts (a first differential value and a second differential value) whose difference from the reference read voltage is different from each other. In the example illustrated in FIG. 11, the value of the LLR can be calculated with respect to 128 kinds of cases. That is, it is possible to calculate the LLR with high accuracy.

Modification Example 2

The value indicating the magnitude of the state may not binary information indicating that the state is either large or small (state: large, or state: small) as described above. For example, the value may be information capable of discriminating three kinds of "state: small", "state: intermediate", and "state: large". FIG. 12 is a view illustrating an example of a state division method. FIG. 12 illustrates an example of discriminating three kinds of "state: small", "state: intermediate", and "state: large" by a combination of a state ST1 that is information for discriminating "state: small" and "state: intermediate", and a state ST2 that is information for discriminating "state: intermediate" and "state: large".

In the example illustrated in FIG. 12, the state ST1 is a one-bit value that becomes "1" in the case of the state B or less, and becomes "0" in the case of the state C or greater. In addition, the state ST2 is a one-bit value that becomes "1" in the case of the state D or less, and becomes "0" in the case of the state E or greater. The values of the state ST1 and the state ST2 can be obtained by single state read using read voltages different from each other. It is possible to determine that a state corresponds to which one of the "state: small", the "state: intermediate", and the "state: large" by the two-bit value.

Figures 13, 14:
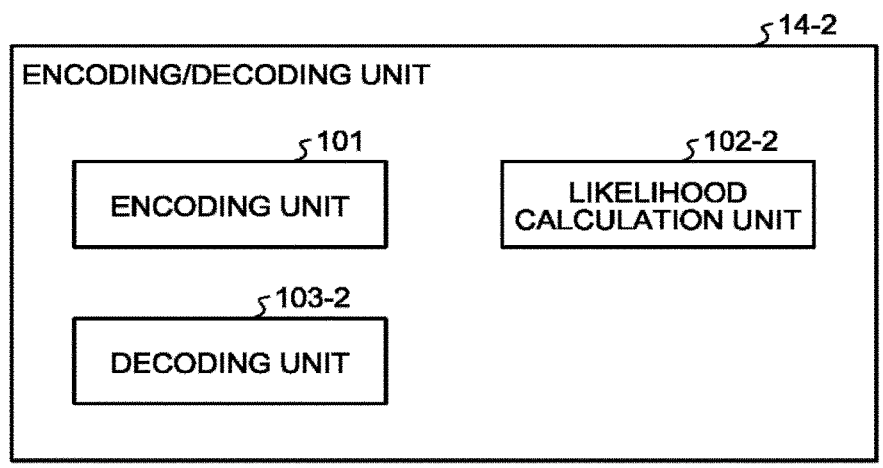
FIG. 13 is a view illustrating an example of an LLR table that is used in a Modification Example 2.
FIG. 14 is a block diagram illustrating an example of a functional configuration of an encoding/decoding unit of a second embodiment.

FIG. 13 is a view illustrating an example of the LLR table that is used in a Modification Example 2. FIG. 13 is an example of the LLR table in which values of the LLR are determined in accordance with combinations (128 kinds) of seven bits of the read result (HB) of the hard bit read, the read results of lower side and higher side shift reads (lower side shift, higher side sift), states ST1 of an adjacent cell (state ST1 (up), state ST1 (down)), and states ST2 of the adjacent cell (state ST2 (up), state ST2 (down)). When using the LLR table, it is possible to finely reflect an influence from the adjacent cell on calculation of the LLR.

Modification Example 3

The LLR may be calculated in consideration of only a state of one adjacent cell among adjacent cells. For example, in a memory cell at an end of the bit line, only an adjacent cell that is adjacent to an upper word line, or an adjacent cell that is adjacent to a lower word line may exist. Even in this case, the LLR is calculated in consideration of only a state of an adjacent cell that is adjacent to one side.

Furthermore, the Modification Examples 1 to 3 are applicable to the following embodiments.

Second Embodiment

A memory system according to a second embodiment performs decoding by using a plurality of LLR tables. FIG. 14 is a block diagram illustrating an example of a functional configuration of an encoding/decoding unit 14-2 of the second embodiment. Furthermore, respective units other than the encoding/decoding unit 14-2 are the same as in FIG. 1 of the first embodiment, and thus description thereof will be omitted.

As illustrated in FIG. 14, the encoding/decoding unit 14-2 includes an encoding unit 101, a likelihood calculation unit 102-2, and a decoding unit 103-2.

In the second embodiment, functions of the likelihood calculation unit 102-2 and the decoding unit 103-2 are different from the first embodiment. The encoding unit 101 is the same as in FIG. 6 as a block diagram of the encoding/decoding unit 14 according to the first embodiment. Accordingly, the same reference numeral will be given thereto, and description thereof will be omitted.

Figure 15:
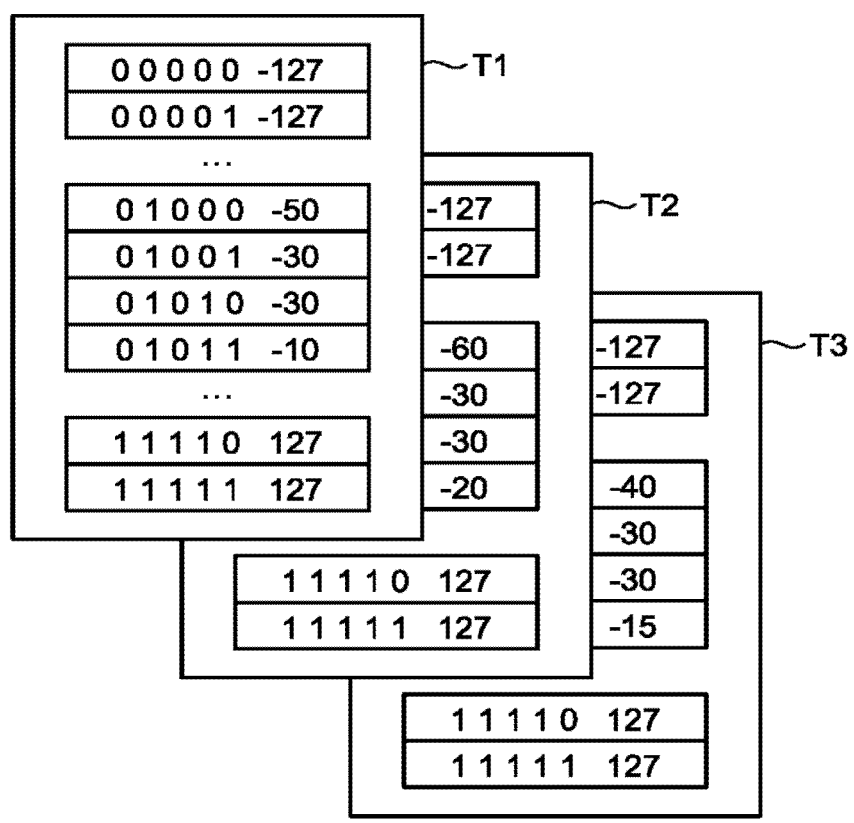
FIG. 15 is a view illustrating an example of a plurality of LLR tables that are used in this embodiment.

The likelihood calculation unit 102-2 calculates the LLR by using an LLR table that is selected among a plurality of LLR tables. FIG. 15 is a view illustrating an example of the plurality of LLR tables that are used in this embodiment. As illustrated in FIG. 15, in LLR tables T1, T2, and T3, LLR values different from each other are correlated to at least partial input values. Furthermore, a magnitude relationship of the LLRs in each of the LLR tables is maintained. When data is read by using the plurality of LLR tables, it is possible to execute a plurality of types of soft bit decoding.

For example, the likelihood calculation unit 102-2 selects one LLR table from the plurality of LLR tables in a sequence determined in advance, and calculates the LLR by using the selected LLR table. When decoding by the calculated LLR fails, the likelihood calculation unit 102-2 selects the subsequent LLR table and repeats the processing.

A selection method of the LLR table is not limited thereto, and any selection method may be used. For example, the likelihood calculation unit 102-2 may select the LLR table in accordance with an elapsed time after performing writing processing. When the elapsed time is long, a possibility of occurrence of charge leakage increases. Accordingly, when LLR tables are prepared in consideration of a variation in a threshold voltage corresponding to the elapsed time, the likelihood calculation unit 102-2 can select an LLR table corresponding to the elapsed time.

A temperature history in the memory system may be stored, and the likelihood calculation unit 102-2 may select the LLR in accordance with the temperature history. For example, when a high-temperature state continues, a possibility of occurrence of charge leakage and the like increases. That is, the influence equivalent to the elapse of time is present. Accordingly, when an LLR table is prepared in consideration of a variation of the threshold voltage corresponding to the temperature, the likelihood calculation unit 102-2 can select the LLR table corresponding to the temperature history.

Returning to FIG. 14, the decoding unit 103-2 decodes a code word by using an LLR that is calculated by using an LLR table that is selected. In addition, when decoding fails, the decoding unit 103-2 further decodes the code word by using an LLR that is calculated by using an LLR table that is subsequently selected.

Figure 16:
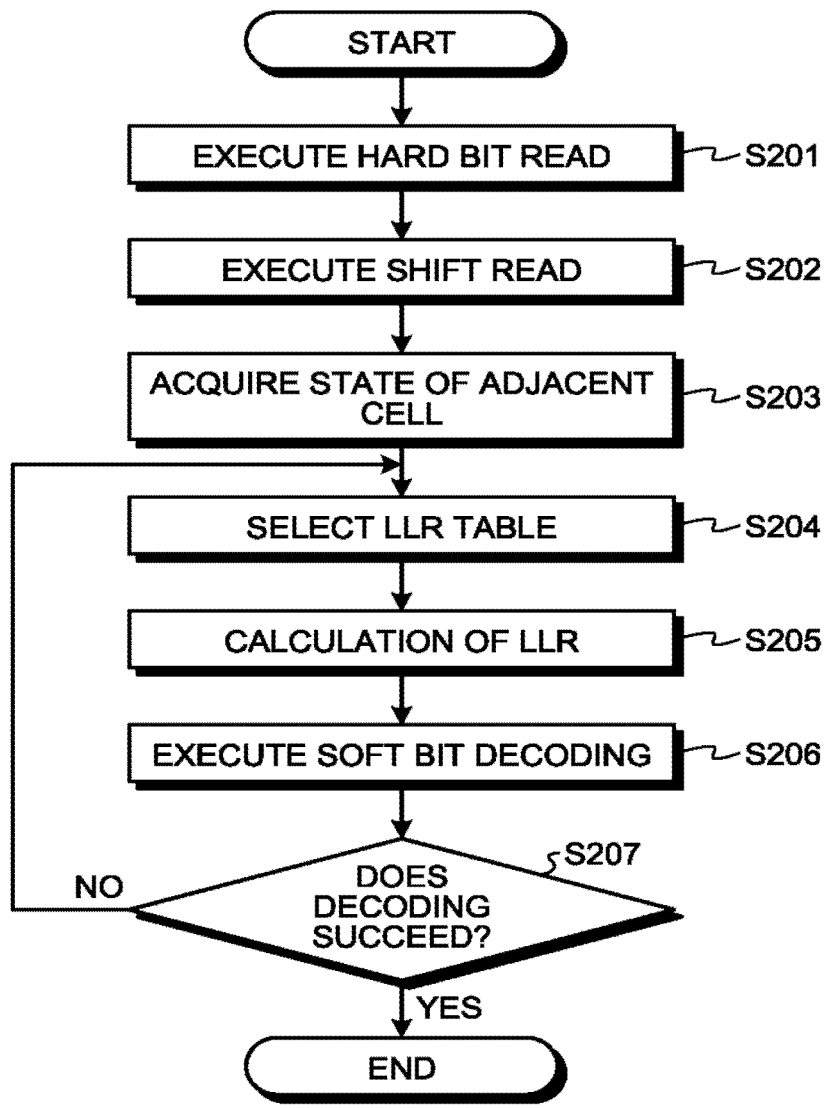
FIG. 16 is a flowchart illustrating an example of decoding processing in the second embodiment.

Next, decoding processing by the memory system according to the second embodiment configured as described above will be described with reference to FIG. 16. FIG. 16 is a flowchart illustrating an example of decoding processing in the second embodiment.

Processing in Step S201 to Step S203 is the same as in Step S101 to Step S103 in the decoding processing of the first embodiment, and thus description thereof will be omitted.

The likelihood calculation unit 102-2 selects one LLR table from a plurality of LLR tables (Step S204). The likelihood calculation unit 102-2 calculates the LLR by using read data, and the selected LLR table (Step S205). The decoding unit 103-2 executes soft bit decoding by using the LLR that is calculated (Step 3206).

The decoding unit 103-2 determines whether or not the soft bit decoding succeeds (Step S207). In the case of failure (Step S207: No), the likelihood calculation unit 102-2 selects the subsequent LLR table and repeats the processing (Step S204). In the case of success (Step S207: Yes), the decoding processing is terminated.

The likelihood calculation unit 102-2 may calculate LLRs in parallel by using two or more LLR tables selected from the plurality of LLR tables. In addition, the decoding unit 103-2 may execute, in parallel, the soft bit decoding using two or more LLRs, which are calculated in parallel. According to this, it is possible to speed up the decoding processing.

Figure 17:
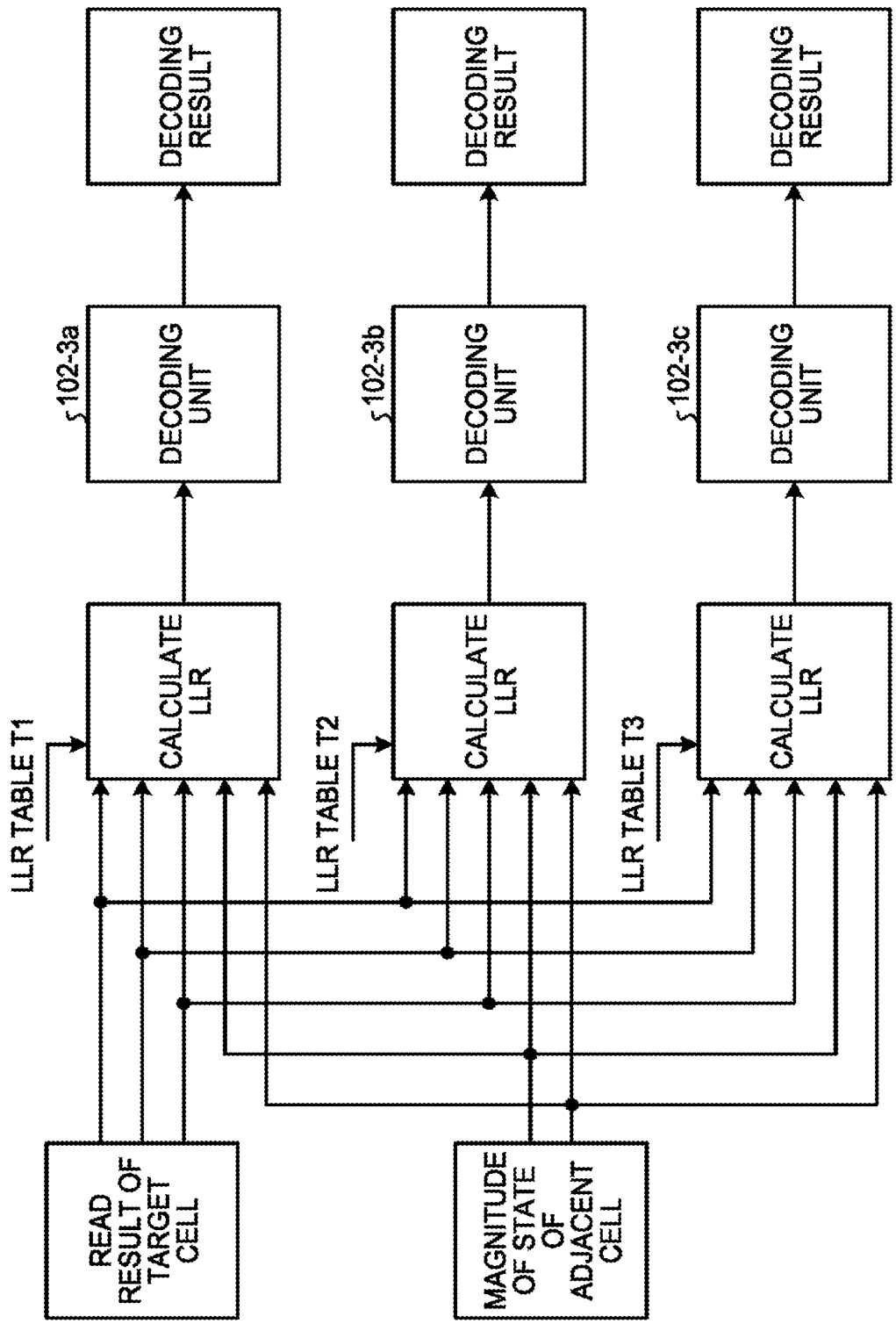
FIG. 17 is a view illustrating a configuration example of a decoding unit in the case of executing soft bit decoding in parallel.

FIG. 17 is a view illustrating a configuration example of the decoding unit 103-2 when the soft bit decoding is executed in parallel. As illustrated in FIG. 14, the memory system may include a plurality of decoding units 103-2a, 103-2b, and 103-2c that execute soft bit decoding. The decoding units 103-2a, 103-2b, and 103-2c decode a code word by using LLRs that are calculated by using LLR tables different from each other. According to this configuration, it is possible to input the LLRs obtained from the plurality of LLR tables at a time, and it is possible to obtain decoding results of the soft bit decoding at a time.

In this manner, in the memory system according to the second embodiment, the plurality of LLR tables are used, and thus it is possible to raise accuracy of error correcting without increasing the number of times of read.

Third Embodiment

A memory system according to a third embodiment executes soft bit decoding without using a state of an adjacent cell, and when the soft bit decoding fails, the memory system executes soft bit decoding using the state of the adjacent cell.

Figure 18:
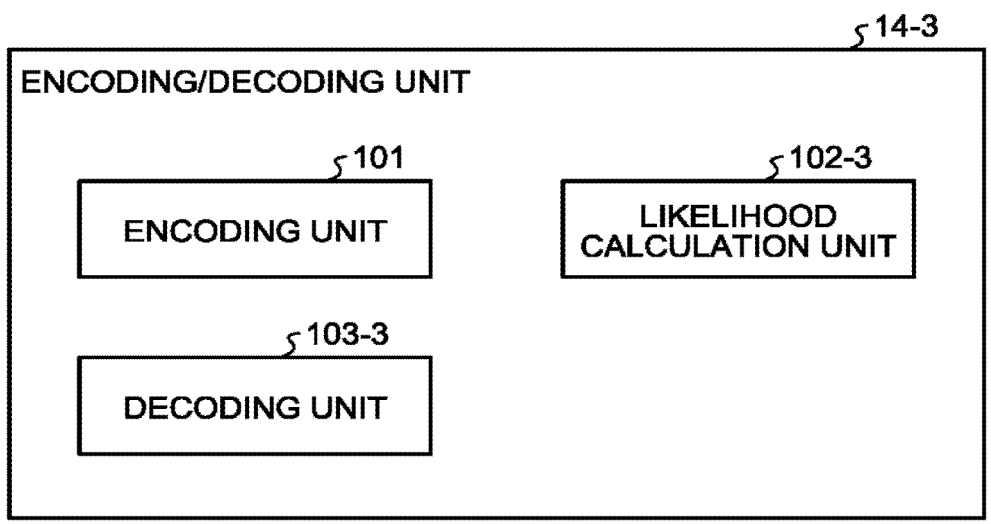
FIG. 18 is a block diagram illustrating an example of a functional configuration of an encoding/decoding unit of a third embodiment.

FIG. 18 is a block diagram illustrating an example of a functional configuration of an encoding/decoding unit 14-3 of a third embodiment. Furthermore, respective units other than the encoding/decoding unit 14-3 are the same as in FIG. 1 in the first embodiment, and thus description thereof will be omitted.

As illustrated in FIG. 18, the encoding/decoding unit 14-3 includes an encoding unit 101, a likelihood calculation unit 102-3, and a decoding unit 103-3.

In the third embodiment, functions of the likelihood calculation unit 102-3 and the decoding unit 103-3 are different from the first embodiment. The encoding unit 101 is the same as in FIG. 6 as a block diagram of the encoding/decoding unit 14 according to the first embodiment. Accordingly, the same reference numeral will be given thereto, and description thereof will be omitted.

First, the likelihood calculation unit 102-3 calculates the LLR without using a state of an adjacent cell. For example, the likelihood calculation unit 102-3 calculates an LLR corresponding to the read result (HB) of the hard bit read and the read results of the higher and lower side shift reads (lower side shift, higher side shift) by using an LLR table (hereinafter, referred to as "simple LLR table") obtained by excluding columns of the state (up) and the state (down) from the LLR table in FIG. 7. When decoding by the LLR calculated as described above fails, the likelihood calcula-tion unit 102-3 calculates an LLR by using the state of the adjacent cell. For example, the likelihood calculation unit 102-3 calculates an LLR corresponding to a five-bit input value by using the LLR table in FIG. 7.

First, the decoding unit 103-3 executes soft bit decoding by using the LLR that is calculated without using the state of the adjacent cell. When the soft bit decoding succeeds, the decoding unit 103-3 terminates the decoding processing. When where the soft bit decoding fails, the decoding unit 103-3 further executes the soft bit decoding by using the LLR that is calculated by the likelihood calculation unit 102-3 by using the state of the adjacent cell.

Figure 19:
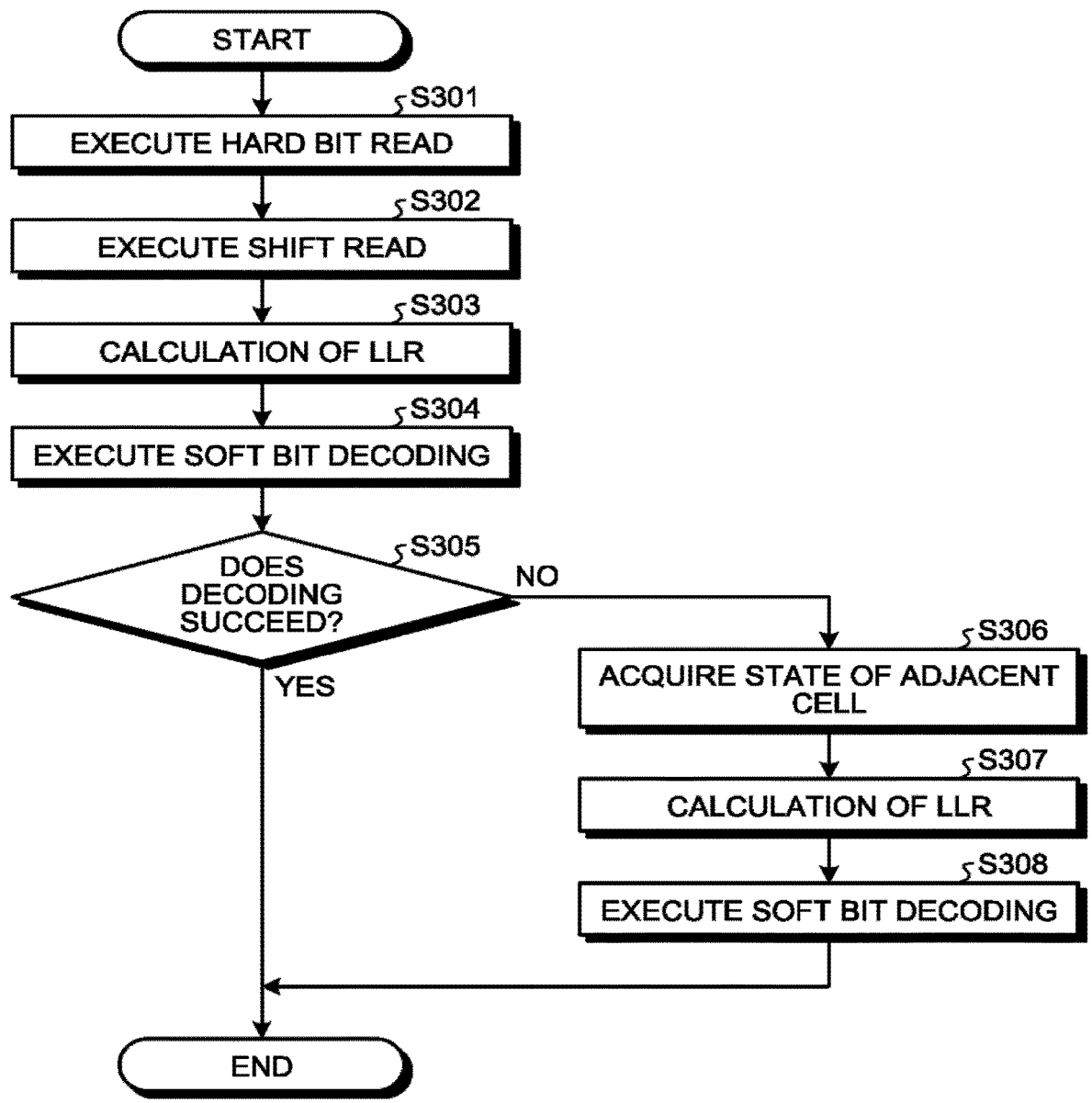
FIG. 19 is a flowchart illustrating an example of decoding processing in the third embodiment.

Next, the decoding processing by the memory system according to the third embodiment configured as described above will be described with reference to FIG. 19. FIG. 19 is a flowchart illustrating an example of the decoding processing in the third embodiment.

Processing in Step S301 to Step S302 is the same as in Step S101 to Step S102 in the decoding processing of the first embodiment, and thus description thereof will be omitted.

The likelihood calculation unit 102-3 acquires read data obtained through respective kinds of processing from Step S301 to Step S302 from the memory I/F 13. The likelihood calculation unit 102-3 calculates an LLR by using the read data that is acquired (Step S303). For example, the likelihood calculation unit 102-3 calculates an LLR corresponding to a read result of the hard bit read of a target cell, and read results of the higher and lower side shift reads (lower side shift, higher side shift) by using the simple LLR table.

The decoding unit 103-3 executes soft bit decoding using the LLR that is calculated in Step S303 (Step S304). The decoding unit 103-3 determines whether or not the soft bit decoding succeeds (Step S305). In the case of success (Step S305: Yes), the decoding processing is terminated.

In the case of failure (Step S305: No), the control unit 11 gives an instruction for execution of the single state read using a read voltage that is determined in advance with respect to an adjacent cell, and acquires a state of the adjacent cell adjacent to the target cell (Step S306).

The likelihood calculation unit 102-3 acquires the read data obtained in Step S306 from the memory I/F 13 in addition to the read data obtained in Step S301 and Step S302. The likelihood calculation unit 102-3 calculates an LLR by using the acquired read data, and the LLR table, for example, as illustrated in FIG. 7 (Step S307). The decoding unit 103-3 further executes the soft bit decoding by using the LLR that is calculated (Step S308).

As described above, in the memory system according to the third embodiment, the soft bit decoding is executed without using the state of the adjacent cell, and when the soft bit decoding fails, the memory system executes the soft bit decoding using the state of the adjacent cell. According to this, it is possible to further shorten a processing time in the decoding processing.

Fourth Embodiment

A memory system according to a fourth embodiment sequentially executes the hard bit decoding and a plurality of soft bit decoding in which values shifted from the reference read voltage are gradually varied. At this time, when at least parts of a plurality of kinds of processing are executed in parallel, it is possible to further shorten the processing time. For example, processing of obtaining the read result of the shift read and the state of the adjacent cell, which are used when performing the soft bit decoding, is executed in parallel to execution of the hard bit decoding.

Figure 20:
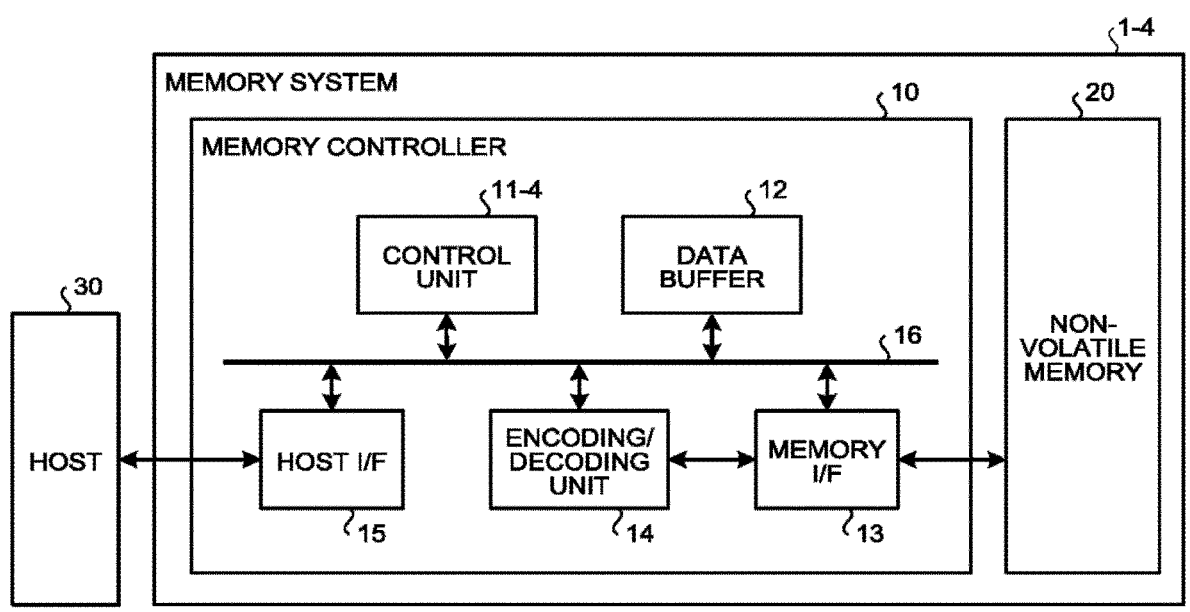
FIG. 20 is a block diagram illustrating a schematic configuration example of a memory system according to a fourth embodiment.

FIG. 20 is a block diagram illustrating a schematic configuration example of a memory system 1-4 according to the fourth embodiment. In the fourth embodiment, a function of the control unit 11-4 is different from the first embodiment. Other functional units are the same as in FIG. 1 as a block diagram of the memory system 1 according to the first embodiment. Accordingly, the same reference numeral will be given thereto, and description thereof will be omitted.

The control unit 11-4 controls read processing so that the hard bit decoding and at least a part of processing of the soft bit decoding are executed in parallel.

Figure 21:
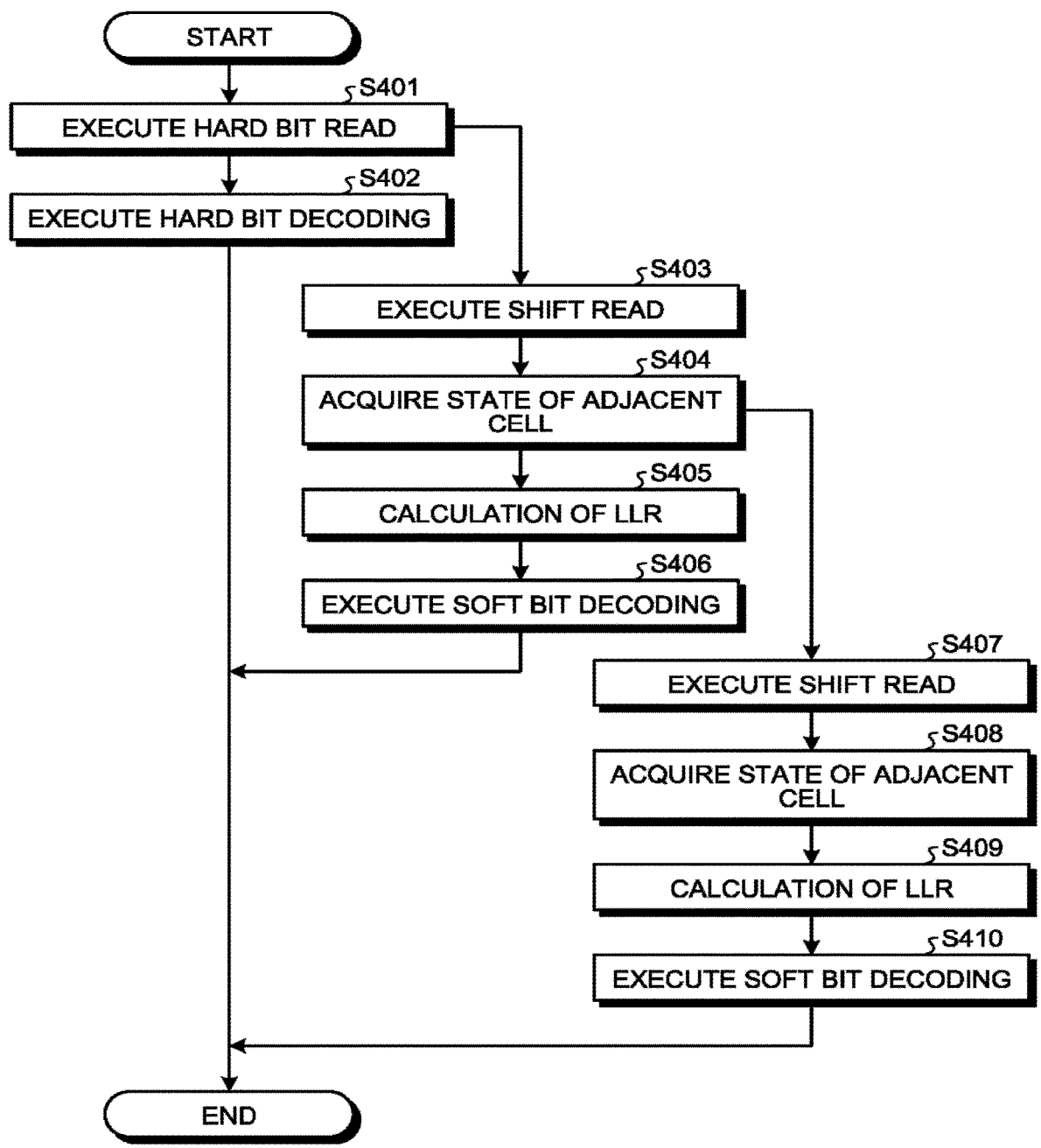
FIG. 21 is a flowchart illustrating an example of decoding processing in the fourth embodiment.

Next, decoding processing by the memory system 1-4 according to the fourth embodiment configured as described above will be described with reference to FIG. 21. FIG. 21 is a flowchart illustrating an example of the decoding processing in the fourth embodiment.

The control unit 11-4 executes the hard bit read of a target cell (Step S401). The decoding unit 103 executes the hard bit decoding using a read result of the hard bit read (Step S402).

After giving an instruction for execution of the hard bit read, the control unit 11-4 gives an instruction for execution of the shift read of the target cell (Step S403) and acquisition of a state of an adjacent cell that is adjacent to the target cell (Step S404) in parallel to hard bit decoding by the decoding unit 103.

The likelihood calculation unit 102 acquires read data obtained through respective kinds of processing in Step S401, Step S403, and Step S404 from the memory I/F 13, and calculates an LLR by using the read data that is acquired (Step S405). The decoding unit 103 executes the soft bit decoding using the LLR that is calculated (Step S406).

After giving an instruction for execution of Step S403 and Step S404, the control unit 11-4 further gives an instruction for execution of the shift read of the target cell (Step S407) and acquisition of a state of an adjacent cell that is adjacent to the target cell (Step S408) in parallel with the soft bit decoding by the decoding unit 103. The shift read in Step S407 is executed in a shift amount different from a shift amount in the shift read in Step 3404. For example, the control unit 11-4 executes the shift reads by shift amounts of 3ΔR to a higher side and a lower side as described in FIG. 11 in Step S404, and executes the shift reads by shift amounts of 5ΔR to the higher side and the lower side as described in FIG. 11 in the shift read in Step S407.

Processing in Step S408 to Step S410 is the same as in Step S404 to Step S406, and thus description thereof will be omitted. Furthermore, in the case of executing the shift read only once, it is not necessary to execute Step S407 to Step S410. In addition, the soft bit read may be executed between Step S402 and Step S403, and the soft bit decoding using a soft bit obtained by soft bit read may be executed.

As described above, in the memory system according to the fourth embodiment, parts of a plurality of kinds of processing included in the decoding processing are executed in parallel. According to this, it is possible to further shorten a time necessary for decoding.

Fifth Embodiment

A position at which a bit value varies fluctuates in accordance with how to execute decoding. For example, in the example illustrated in FIG. 9, the bit value varies at four sites of the read positions P1 to P4. Among the read positions, the read positions P2 and P4 correspond to a read position at which the bit value varies from "0" to "1". Similarly, the read positions P1 and P3 correspond to a read position at which the bit value varies from "1" to "0".

In the embodiments, an LLR table that calculates a value of the same LLR is used without discriminating a plurality of read positions at which the bit value varies in the same manner. In the fifth embodiment, the plurality of read positions at which the bit value varies in the same manner are discriminated, and a value of a different LLR can be calculated at respective read positions.

Figure 22:
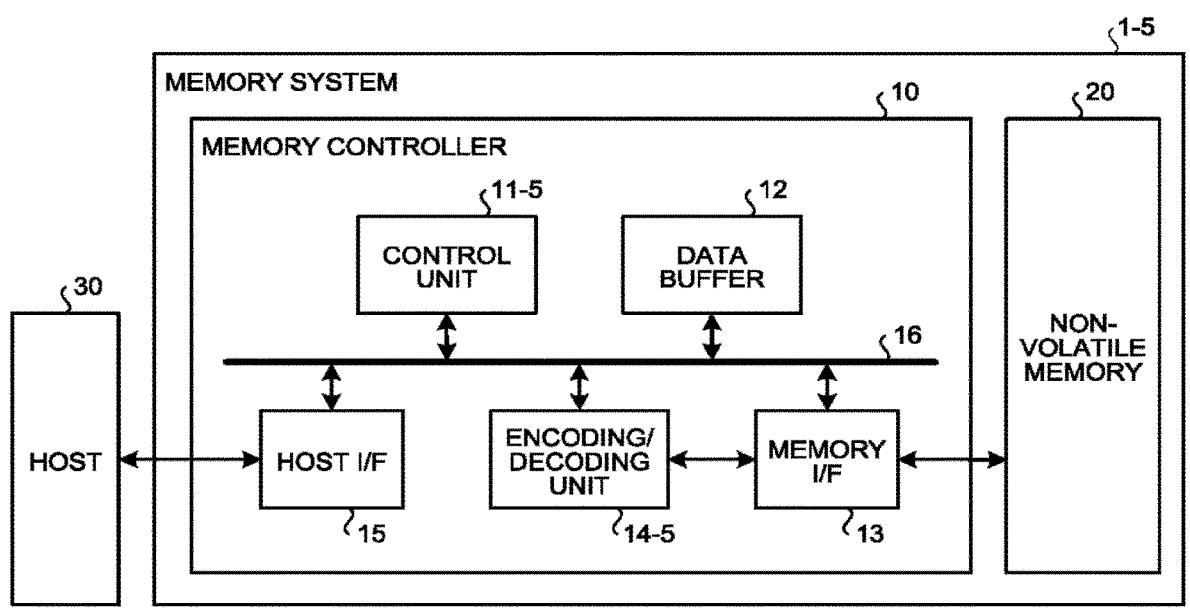
FIG. 22 is a block diagram illustrating a schematic configuration example of a memory system according to a fifth embodiment.

FIG. 22 is a block diagram illustrating a schematic configuration example of the memory system 1-5 according to the fifth embodiment. In the fifth embodiment, functions of a control unit 11-5 and an encoding/decoding unit 14-5 are different from the first embodiment. Other functional units are the same as in FIG. 1 as a block diagram of the memory system 1 according to the first embodiment. Accordingly, the same reference numeral will be given thereto, and description thereof will be omitted.

The control unit 11-5 further executes read processing for discriminating read positions. FIG. 23 is a view illustrating a read position in the read processing at this time. In the example illustrated in FIG. 23, the control unit 11-5 executes read processing at a read voltage corresponding to a read position P5. For example, the control unit 11-5 executes single state read using a read voltage (fifth read voltage) corresponding to the read position P5 with respect to a target cell. The single state read can be analyzed as read processing of a bit for determination of the magnitude of a state of the target cell (the magnitude of a threshold voltage of the target cell). In the following description, a bit (fifth data) that is a read result of the single state read may be referred to as "determination bit".

In the example illustrated in FIG. 23, it is possible to discriminate the read positions P2 and P4 at which a bit value varies in the same manner by using a determination bit. In addition, it is possible to discriminate the read positions P1 and P3 at which a bit value varies in the same manner.

Figures 24, 25:
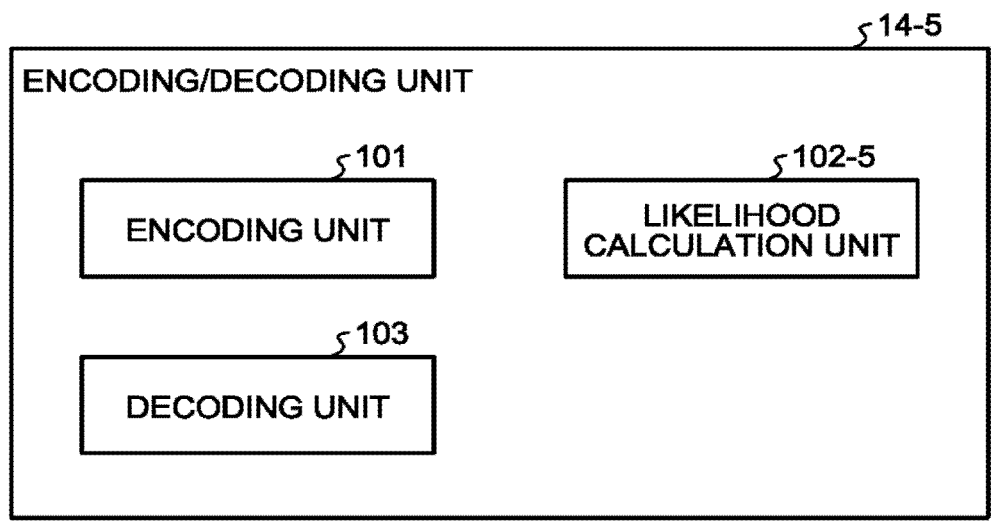
FIG. 24 is a block diagram illustrating an example of a functional configuration of an encoding/decoding unit of the fifth embodiment.
FIG. 25 is a view illustrating an example of an LLR table that is used in the fifth embodiment.

FIG. 24 is a block diagram illustrating an example of a functional configuration of the encoding/decoding unit 14-5 according to the fifth embodiment. As illustrated in FIG. 24, the encoding/decoding unit 14-5 includes an encoding unit 101, a likelihood calculation unit 102-5, and a decoding unit 103.

In the fifth embodiment, a function of the likelihood calculation unit 102-5 is different from the first embodiment. The encoding unit 101 and the decoding unit 103 are the same as in FIG. 6 as a block diagram of the encoding/decoding unit 14 according to the first embodiment. Accordingly, the same reference numeral will be given thereto, and description thereof will be omitted.

The likelihood calculation unit 102-5 calculates an LLR by using the determination bit in addition to the read result of the hard bit read of the target cell, the read result of the shift read of the target cell, and the state of the adjacent cell. FIG. 25 is a view illustrating an example of an LLR table that is used in the fifth embodiment. As illustrated in FIG. 25, the LLR table of this embodiment determines a value of the LLR in accordance with a combination of six bits including the HB, the read results of the higher and lower side shift reads, the determination bit, and states of adjacent cells.

Figure 26:
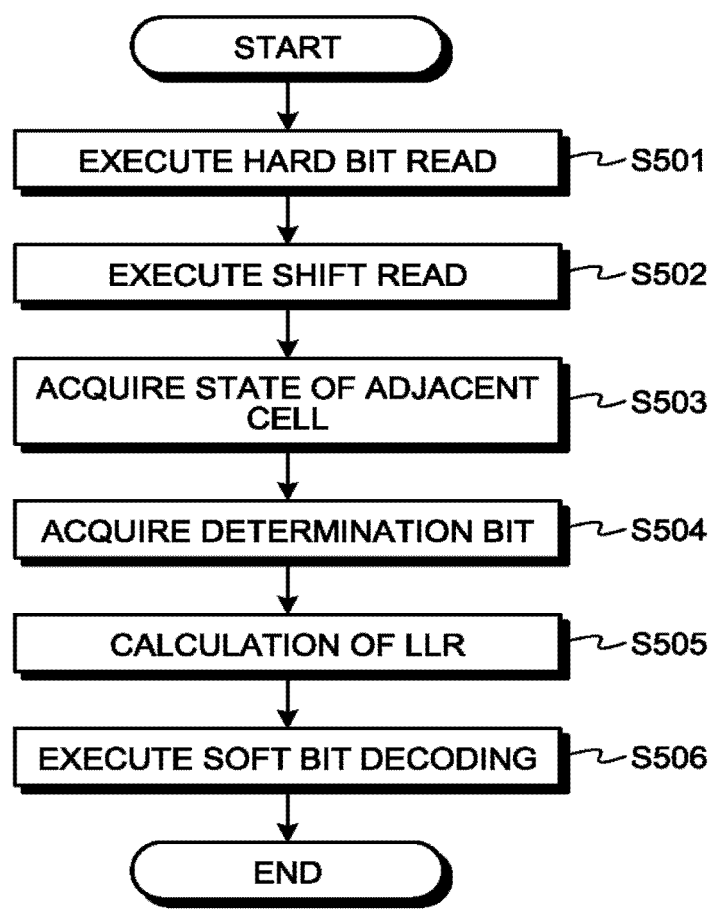
FIG. 26 is a flowchart illustrating an example of decoding processing in the fifth embodiment.

Next, decoding processing by the memory system 1-5 according to the fifth embodiment configured as described above will be described with reference to FIG. 26. FIG. 26 is a flowchart illustrating an example of the decoding processing in the fifth embodiment.

Processing in Step S501 to Step S503 is the same as in Step S101 to Step S103 in the memory system 1 according to the first embodiment, and thus description thereof will be omitted.

The control unit 11-5 acquires the determination bit (Step S504). For example, the control unit 11-5 instructs a target cell to execute the single state read using a read voltage that is determined to discriminate a read position.

The likelihood calculation unit 102-5 acquires read data obtained in processing from Step S501 to Step S504 from the memory I/F 13. The likelihood calculation unit 102-5 calculates an LLR by using the read data that is acquired (Step S505). For example, the likelihood calculation unit 102-5 calculates the LLR corresponding to a read result of the hard bit read of the target cell, read results of the higher and lower side shift reads (lower side shift, higher side shift), a determination bit, and states of adjacent cells (state (up), state (down)) by using the LLR table illustrated in FIG. 25.

The decoding unit 103 executes the soft bit decoding using the LLR that is calculated (Step S506).

In a method of calculating the LLR by using a soft bit obtained through operation (XNOR and the like) of the read result obtained in the shift read, it is possible to further reduce a data amount that is transmitted to a memory controller from the nonvolatile memory 20 in comparison to a configuration in which the read result is used as is as in this embodiment. According to this embodiment, since the processing of reading the determination bit is executed, it is possible to discriminate a read position. That is, it is not necessary to read all pages. According to this, it is possible to further suppress a decoding processing time from being lengthened in comparison to the case of reading all pages.

As described above, according to the first to fifth embodiments, it is possible to shorten a time necessary for decoding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory including,
   a memory string that includes a plurality of memory cells including a first memory cell, a second memory cell, and a third memory cell that are connected in series, and a selection transistor that is electrically connected to the plurality of memory cells in series,
   a bit line that is connected to the memory string,
   a first word line that is electrically connected to a gate of the first memory cell of the memory string,
   a second word line that is electrically connected to a gate of the second memory cell of the memory string, and
   a third word line that is electrically connected to a gate of the third memory cell of the memory string; and
a memory controller configured to read data of the first memory cell by causing the nonvolatile memory to apply a first read voltage to the first word line, to read data of the second memory cell by causing the nonvolatile memory to apply a second read voltage to the second word line, and to read data of the third memory cell by causing the nonvolatile memory to apply a third read voltage to the third word line,
wherein the memory controller is configured to read data of the second memory cell by causing the nonvolatile memory to apply a fourth read voltage that is varied from the second read voltage to the second word line, in parallel to processing of decoding first data that is read data by the second read voltage, and
the memory controller is configured to obtain likelihood information by using a table selected from a plurality of tables in which pieces of the likelihood information, which are different from each other, are determined with respect to the first data, second data that is read data by the fourth read voltage, and at least one of third data that is read data by the first read voltage and fourth data that is read data by the third read voltage, to decode data read from the second memory cell on the basis of the likelihood information.

2. The memory system according to claim 1,
wherein the memory controller obtains the likelihood information by using a first table among the plurality of tables, decodes data that is read from the second memory cell by using the likelihood information that is obtained, and further obtains the likelihood information by using a second table different from the first table among the plurality of tables when decoding fails.

3. A memory system, comprising:
a nonvolatile memory including,
   a memory string that includes a plurality of memory cells including a first memory cell, a second memory cell, and a third memory cell that are connected in series, and a selection transistor that is electrically connected to the plurality of memory cells in series,
   a bit line that is connected to the memory string,
   a first word line that is electrically connected to a gate of the first memory cell of the memory string,
   a second word line that is electrically connected to a gate of the second memory cell of the memory string, and
   a third word line that is electrically connected to a gate of the third memory cell of the memory string; and
a memory controller configured to read data of the first memory cell by causing the nonvolatile memory to apply a first read voltage to the first word line, to read data of the second memory cell by causing the nonvolatile memory to apply a second read voltage to the second word line, and to read data of the third memory cell by causing the nonvolatile memory to apply a third read voltage to the third word line,
wherein the memory controller is configured to read data of the second memory cell by causing the nonvolatile memory to apply a fourth read voltage that is varied from the second read voltage to the second word line, in parallel to processing of decoding first data that is read data by the second read voltage, and
the memory controller is configured to obtain likelihood information on the basis of the first data, second data that is read data by the fourth read voltage, and at least one of third data that is read data by the first read voltage and fourth data that is read data by the third read voltage, to decode data read from the second memory cell on the basis of the likelihood information,
wherein the memory controller includes a plurality of decoding units that obtain the likelihood information by using any one among a plurality of tables in which pieces of the likelihood information, which are different from each other, are determined with respect to the first data, the second data, and at least one of the third data and the fourth data, and decode data that is read from the second memory cell by using the likelihood information that is obtained.

4. The memory system according to claim 1,
wherein the memory controller reads a plurality of pieces of the second data from the second memory cell by using a plurality of the second read voltages including one or more read voltages in which a difference from the first read voltage is a first differential value, and one or more read voltage in which a difference from the first read voltage is a second differential value.

5. The memory system according to claim 1,
wherein the memory controller,
reads a plurality of the third data from the first memory cell by using a plurality of the first read voltages, and
reads a plurality of the fourth data from the third memory cell by using a plurality of the third read voltages.

6. The memory system according to claim 1, wherein
the third data is information indicating whether or not a threshold voltage of the first memory cell is greater than the first read voltage, and
the fourth data is information indicating whether or not a threshold voltage of the third memory cell is greater than the third read voltage.

7. The memory system according to claim 3,
wherein the memory controller obtains the likelihood information by using a first table among the plurality of tables, decodes data that is read from the second memory cell by using the likelihood information that is obtained, and further obtains the likelihood information by using a second table different from the first table among the plurality of tables when decoding fails.

8. The memory system according to claim 3,
wherein the memory controller reads a plurality of pieces of the second data from the second memory cell by using a plurality of the second read voltages including one or more read voltages in which a difference from the first read voltage is a first differential value, and one or more read voltage in which a difference from the first read voltage is a second differential value.

9. The memory system according to claim 3,
wherein the memory controller,
reads a plurality of the third data from the first memory cell by using a plurality of the first read voltages, and
reads a plurality of the fourth data from the third memory cell by using a plurality of the third read voltages.

10. The memory system according to claim 3, wherein
the third data is information indicating whether or not a threshold voltage of the first memory cell is greater than the first read voltage, and
the fourth data is information indicating whether or not a threshold voltage of the third memory cell is greater than the third read voltage.

11. A method of controlling a nonvolatile memory, the nonvolatile memory including:
a memory string that includes a plurality of memory cells including a first memory cell, a second memory cell, and a third memory cell that are connected in series, and a selection transistor that is electrically connected to the plurality of memory cells in series;
a bit line that is connected to the memory string;
a first word line that is electrically connected to a gate of the first memory cell of the memory string;
a second word line that is electrically connected to a gate of the second memory cell of the memory string; and
a third word line that is electrically connected to a gate of the third memory cell of the memory string,
the method comprising:
reading data of the first memory cell by causing the nonvolatile memory to apply a first read voltage to the first word line;
reading data of the second memory cell by causing the nonvolatile memory to apply a second read voltage to the second word line;
reading data of the third memory cell by causing the nonvolatile memory to apply a third read voltage to the third word line;
reading data of the second memory cell by causing the nonvolatile memory to apply a fourth read voltage that is varied from the second read voltage to the second word line, in parallel to processing of decoding first data that is read data by the second read voltage;
obtaining likelihood information on the basis of the first data, second data that is read data by the fourth read voltage, and at least one of third data that is read data by the first read voltage and fourth data that is read data by the third read voltage; and
decoding data read from the second memory cell on the basis of the likelihood information,
wherein the likelihood information is obtained by using a table selected from a plurality of tables in which pieces of the likelihood information, which are different from each other, are determined with respect to the first data, the second data, and at least one of the third data and the fourth data.

12. The method according to claim 11,
wherein the likelihood information is obtained by using a first table among the plurality of tables, data that is read from the second memory cell is decoded by using the likelihood information that is obtained, and the likelihood information is further obtained by using a second table different from the first table among the plurality of tables when decoding fails.

13. The method according to claim 11,
wherein a plurality of pieces of the second data is read from the second memory cell by using a plurality of the second read voltages including one or more voltage in which a difference from the first read voltage is a first differential value, and one or more read voltage in which a difference from the first read voltage is a second differential value.

14. The method according to claim 11,
wherein a plurality of the third data are read from the first memory cell by using a plurality of the first read voltages, and
a plurality of the fourth data are read from the third memory cell by using a plurality of the third read voltages.

15. The method according to claim 11, wherein
the third data is information indicating whether or not a threshold voltage of the first memory cell is greater than the first read voltage, and
the fourth data is information indicating whether or not a threshold voltage of the third memory cell is greater than the third read voltage.

16. A method of controlling a nonvolatile memory, the nonvolatile memory including:
a memory string that includes a plurality of memory cells including a first memory cell, a second memory cell, and a third memory cell that are connected in series, and a selection transistor that is electrically connected to the plurality of memory cells in series;

a bit line that is connected to the memory string;

a first word line that is electrically connected to a gate of the first memory cell of the memory string;

a second word line that is electrically connected to a gate of the second memory cell of the memory string; and a third word line that is electrically connected to a gate of the third memory cell of the memory string, the method comprising:

reading data of the first memory cell by causing the nonvolatile memory to apply a first read voltage to the first word line;

reading data of the second memory cell by causing the nonvolatile memory to apply a second read voltage to the second word line;

reading data of the third memory cell by causing the nonvolatile memory to apply a third read voltage to the third word line;

reading data of the second memory cell by causing the nonvolatile memory to apply a fourth read voltage that is varied from the second read voltage to the second word line, in parallel to processing of decoding first data that is read data by the second read voltage;

obtaining, by a plurality of decoding units, likelihood information by using any one among a plurality of tables in which pieces of the likelihood information, which are different from each other, are determined with respect to the first data, second data that is read data by the fourth read voltage, and at least one of third data that is read data by the first read voltage and fourth data that is read data by the third read voltage, and decoding, by the plurality of decoding units, data that is read from the second memory cell by using the likelihood information that is obtained.

17. The method according to claim 16, wherein the likelihood information is obtained by using a first table among the plurality of tables, data that is read from the second memory cell is decoded by using the likelihood information that is obtained, and the likelihood information is further obtained by using a second table different from the first table among the plurality of tables when decoding fails.

18. The method according to claim 16, wherein a plurality of pieces of the second data is read from the second memory cell by using a plurality of the second read voltages including one or more read voltage in which a difference from the first read voltage is a first differential value, and one or more read voltage in which a difference from the first read voltage is a second differential value.

19. The method according to claim 16, wherein a plurality of the third data are read from the first memory cell by using a plurality of the first read voltages, and a plurality of the fourth data are read from the third memory cell by using a plurality of the third read voltages.

20. The method according to claim 16, wherein the third data is information indicating whether or not a threshold voltage of the first memory cell is greater than the first read voltage, and the fourth data is information indicating whether or not a threshold voltage of the third memory cell is greater than the third read voltage.

* * * * *